(12) United States Patent
Fratin et al.

(10) Patent No.: US 11,271,153 B2
(45) Date of Patent: Mar. 8, 2022

(54) SELF-SELECTING MEMORY CELL WITH DIELECTRIC BARRIER

(71) Applicant: Micron Technology, Inc., Boise, ID (US)

(72) Inventors: Lorenzo Fratin, Buccinasco (IT); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/904,385

(22) Filed: Jun. 17, 2020

(65) Prior Publication Data

US 2020/0321520 A1 Oct. 8, 2020

Related U.S. Application Data

(60) Continuation of application No. 16/537,119, filed on Aug. 9, 2019, now Pat. No. 10,720,579, which is a
(Continued)

(51) Int. Cl.
*H01L 45/00* (2006.01)
*H01L 27/24* (2006.01)
*G11C 13/00* (2006.01)

(52) U.S. Cl.
CPC ........ *H01L 45/1246* (2013.01); *H01L 27/249* (2013.01); *H01L 45/06* (2013.01);
(Continued)

(58) Field of Classification Search
CPC ... H01L 45/1246; H01L 27/249; H01L 45/06; H01L 45/1253; H01L 45/141;
(Continued)

(56) References Cited

U.S. PATENT DOCUMENTS 8,157,136 B2 * 4/2012 Lamb .................... B60P 3/0257
222/608
8,299,571 B2 * 10/2012 Ozawa ................ H01L 27/2418
257/530

(Continued)

FOREIGN PATENT DOCUMENTS

JP 2004006579 A 1/2004
JP 2013115436 A 6/2013
KR 20110050011 A 5/2011

OTHER PUBLICATIONS

Japan Patent Office, "Notice of Rejection Ground," issued in connection with Japanese Patent Application No. 2020-510544, dated May 25, 2021 (9 pages).
(Continued)

*Primary Examiner* — Jami Valentine Miller
(74) *Attorney, Agent, or Firm* — Holland & Hart LLP

(57) ABSTRACT

A self-selecting memory cell may be composed of a memory material that changes threshold voltages based on the polarity of the voltage applied across it. Such a memory cell may be formed at the intersection of a conductive pillar and electrode plane in a memory array. A dielectric material may be formed between the memory material of the memory cell and the corresponding electrode plane. The dielectric material may form a barrier that prevents harmful interactions between the memory material and the material that makes up the electrode plane. In some cases, the dielectric material may also be positioned between the memory material and the conductive pillar to form a second dielectric barrier. The second dielectric barrier may increase the symmetry of the memory array or prevent harmful interactions between the memory material and an electrode cylinder or between the memory material and the conductive pillar.

22 Claims, 13 Drawing Sheets

Related U.S. Application Data division of application No. 15/687,038, filed on Aug. 25, 2017, now Pat. No. 10,424,728.

(52) U.S. Cl.
CPC ........ *H01L 45/1253* (2013.01); *H01L 45/141* (2013.01); *H01L 45/16* (2013.01); *H01L 45/1683* (2013.01); *G11C 13/004* (2013.01); *G11C 13/0004* (2013.01); *G11C 13/0061* (2013.01); *G11C 13/0069* (2013.01)

(58) Field of Classification Search
CPC . H01L 45/16; H01L 45/1683; G11C 13/0004; G11C 13/004; G11C 13/0061; G11C 13/0069
USPC .............................................................. 257/4
See application file for complete search history.

(56) References Cited

U.S. PATENT DOCUMENTS

| | | | |
|---|---|---|---|
| 8,634,257 B2 | 1/2014 | Hanzawa et al. | |
| 8,729,523 B2 | 5/2014 | Pio | |
| 8,841,649 B2* | 9/2014 | Pio | H01L 27/2427 257/5 |
| 9,620,712 B2 | 4/2017 | Hayashi et al. | |
| 9,768,234 B2 | 9/2017 | Jo | |
| 9,978,810 B2 | 5/2018 | Pellizzer | |
| 2010/0117054 A1 | 5/2010 | Kim et al. | |
| 2010/0270529 A1 | 10/2010 | Lung | |
| 2011/0140068 A1* | 6/2011 | Ozawa | H01L 27/249 257/4 |
| 2012/0147649 A1 | 6/2012 | Samachisa et al. | |
| 2013/0200326 A1 | 8/2013 | Ju et al. | |
| 2015/0200308 A1* | 7/2015 | Karda | H01L 45/141 257/329 |
| 2017/0125484 A1* | 5/2017 | Pellizzer | H01L 45/144 |
| 2017/0221559 A1 | 8/2017 | Chen et al. | |

OTHER PUBLICATIONS

European Patent Office, "Extended Search Report," issued in connection with European Patent Application No. 18849238.3, dated Apr. 6, 2021 (8 pages.

ISA/KR, International Search Report and Written Opinion of the International Searching Authority, Int'l Appl. PCT/US2018/047661, dated Dec. 6, 2018, Korean Intellectual Property Office, Seo-gu, Daejeon, Republic of Korea, 12 pgs.

* cited by examiner

CROSS-SECTION VIEW

PLANAR VIEW

CROSS-SECTION VIEW

PLANAR VIEW

SELF-SELECTING MEMORY CELL WITH DIELECTRIC BARRIER

CROSS REFERENCE

The present application for patent is a continuation of U.S. patent application Ser. No. 16/537,119 by Fratin et al., entitled "Self-Selecting Memory Cell With Dielectric Barrier," filed Aug. 9, 2019, which is a divisional of U.S. patent application Ser. No. 15/687,038 by Fratin et al., entitled "Self-Selecting Memory Cell With Dielectric Barrier," filed Aug. 25, 2017, each of which is assigned to the assignee hereof, and each of which is expressly incorporated by reference in its entirety herein.

BACKGROUND

The following relates generally to self-selecting memory cells and more specifically to three-dimensional (3D) multi-plane memory.

Memory devices are widely used to store information in various electronic devices such as computers, wireless communication devices, cameras, digital displays, and the like. Information is stored by programming different states into memory cells of a memory device. For example, binary devices have two states, often denoted by a logic "1" or a logic "0." In other systems, more than two states may be stored. To access the stored information, a component of the memory device may read, or sense, the stored state in the memory cell. To store information, a component of the electronic device may write, or program, the state in the memory cell.

Multiple types of memory devices exist, including magnetic hard disks, random access memory (RAM), dynamic RAM (DRAM), synchronous dynamic RAM (SDRAM), ferroelectric RAM (FeRAM), magnetic RAM (MRAM), resistive RAM (RRAM), read only memory (ROM), flash memory, phase change memory (PCM), self-selecting memory, and others. Memory devices may be volatile or non-volatile. Non-volatile memory, e.g., flash memories, may maintain their stored logic state for extended periods of time even in the absence of an external power source. Volatile memory devices, e.g., DRAM, may lose their stored state over time unless they are periodically refreshed by an external power source. Improving memory devices may include increasing memory cell density, increasing read/write speeds, increasing reliability, increasing data retention, reducing power consumption, or reducing manufacturing costs, among other metrics.

DETAILED DESCRIPTION

Figure 1:
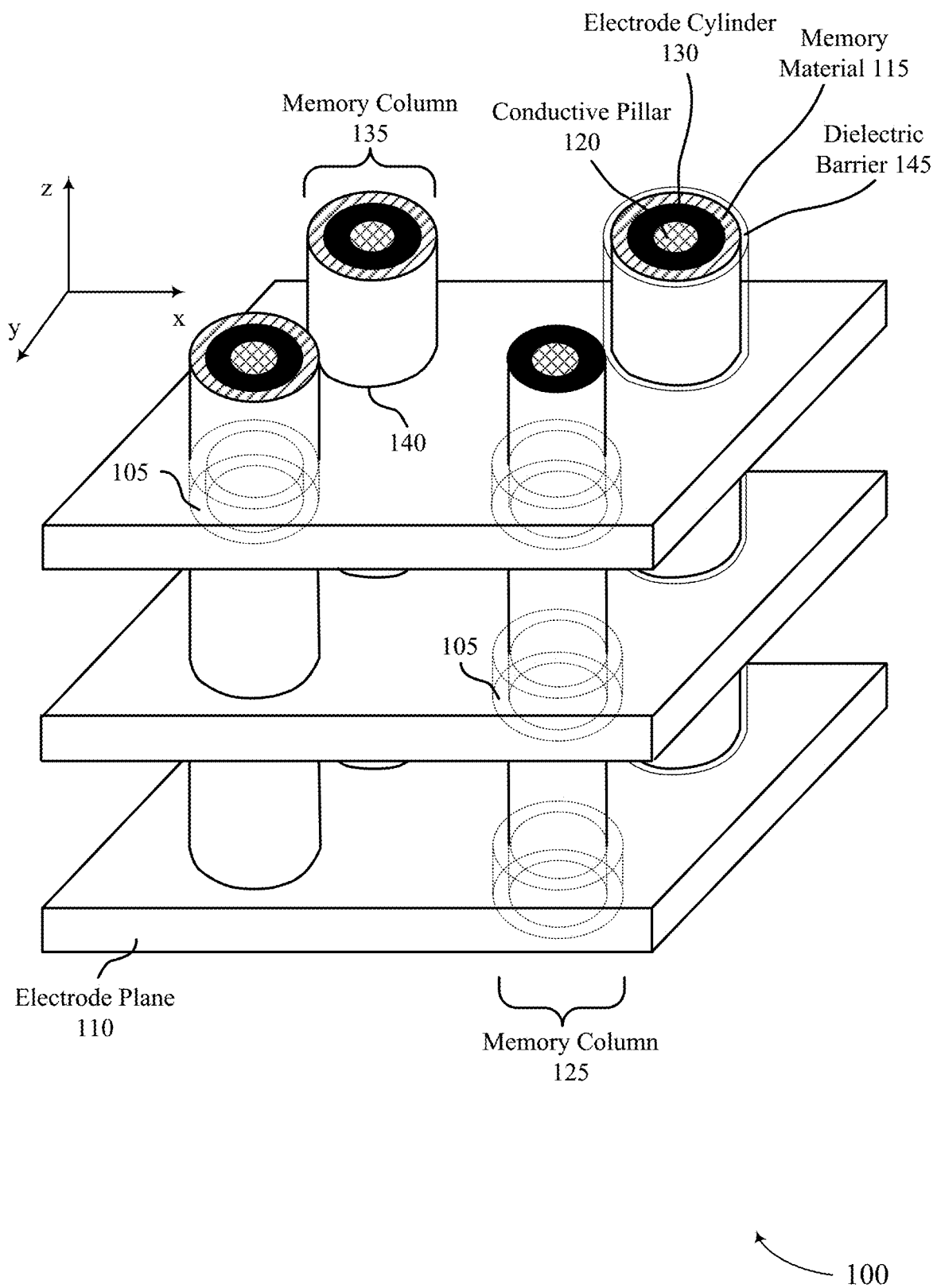
FIG. 1 illustrates a memory array that supports self-selecting memory cells with dielectric barriers in accordance with various embodiments of the present disclosure.

A memory device may include one or more self-selecting memory cells that not only store information, but also facilitate access of the cell. The self-selecting cells may be memory cells that include a chalcogenide. The chalcogenide may, in some cases, exhibit different threshold voltages based on the polarity of the voltage used to access the cell. Although use of chalcogenide may enable self-selecting memory cells, which may reduce the complexity of the memory array architecture, the chalcogenide may be incompatible or less compatible with other materials in the memory array. For example, the chalcogenide may chemically or electrically interact with one or more conductive materials in the array with which it is in contact. These interactions may alter the logic state(s) stored in the memory cells, or the characteristics or operation of the memory array. Such alterations may negatively impact the performance of a memory array, or limit the types of materials that can be used with the chalcogenide in the memory array, or both.

According to the techniques described herein, a memory array may include dielectric barriers between the self-selecting cells and other conductive materials in the memory array. The dielectric barriers may physically separate the chalcogenide from the conductive materials, thereby preventing harmful interactions between the conductive materials and the chalcogenide. The dielectric barrier may be a film of dielectric material that is thin enough to allow the flow of current between the conductive materials and the chalcogenide while also preventing the harmful interactions—providing distinct advantages over other alternatives.

A memory array that includes self-selecting memory cells with dielectric barriers may be formed using at least one of two different types of fabrication processes. In the first type of process, the memory array is formed by alternating planes (e.g., layers) of dielectric planes and electrode planes to create a stack of planes. The self-selecting memory cells, and related dielectric barriers, are then formed within the stack of planes. In the second type of process, the memory array is formed by alternating planes of dielectric planes with placeholder planes to create a stack of planes. The placeholder planes may be composed of a material that is susceptible to a removal process, such as wet-etching. After forming the self-selecting cells and dielectric barriers within the stack of planes, the material in the placeholder planes is replaced with conductive material to form electrode planes.

Features and techniques introduced above are further described below in the context of a memory array. Specific examples are then described for 3D multi-plane memory arrays that include self-selecting cells and one or more dielectric barriers. These and other features of the disclosure are further illustrated by and described with reference to apparatus diagrams, system diagrams, and flowcharts that relate to reading or writing such arrays.

FIG. 1 illustrates a memory array 100 that supports self-selecting memory cells with dielectric barriers. Memory array 100 may be part of a memory device that includes self-selecting memory cells (which may also be referred to as self-selecting memory structures or components). The self-selecting memory cells may act as selection components and memory elements, which may simplify the architecture of the memory array 100. The architecture of memory array 100 may be referred to as a three-dimensional (3D) multi-plane architecture or 3D vertical cross-point memory. A 3D vertical cross-point architecture may refer to an architecture in which memory cells are located at the cross point of each electrode plane and conductive pillar. Although described with reference to a 3D multi-plane architecture, the self-selecting memory cells and dielectric barriers described herein may be used in various other types of memory architectures, including, but not limited to, cross-point architectures, such as two-dimensional (2D) cross-point arrays in which memory cells are located at cross points of access lines, for example.

The use of self-selecting memory structures in memory array 100 may provide relatively high-density data storage with lower production costs compared to other memory architectures. For example, DRAM may use a transistor as the selection component for each memory cell and thus may have a larger memory cell area compared to architectures that employ self-selecting memory cells. The compact area of self-selecting memory cells may allow memory array 100 to feature an increased memory cell density compared to other architectures. The simplified architecture of memory array 100 may also require fewer materials, layers, and/or structures, which may reduce processing steps during manufacture.

The memory array 100 may include one or more electrode planes 110. The electrode planes 110 may also be referred to herein as conductive layers, in some embodiments. The electrode planes 110 may be separated by planes of dielectric material, which may be referred to herein as dielectric layers or dielectric planes. The electrode planes 110 and dielectric planes may extend in the x-y plane and may have a vertical thickness in the z-direction. The alternating electrode planes 110 and dielectric planes may be referred to as a stack. Memory columns 135 may be disposed in openings 140 in the stack so that they extend through the stack (e.g., in a first direction, perpendicularly in a z-direction). In some embodiments, a memory column 135 may include a conductive pillar 120, an electrode cylinder 130, memory material 115, or any combination thereof. Although depicted as concentric cylinders, the electrode cylinder 130 and memory material 115 may be elements of any shape and geometry, relationship, and orientation. Similarly, the conductive pillar 120 may be an element or material of any shape.

Memory cells 105 may be formed within the memory material 115. In some embodiments, memory cells 105 may be formed where one or more materials (e.g., the electrode planes 110, the conductive pillars 120) intersect the memory material 115. A logic state (e.g., a logic "0" or a logic "1") may be written to a memory cell 105 and the memory cell 105 may store the logic state. In some embodiments, the logic state may correspond to one or more bits of data. In some examples, a memory cell 105 may include a chalcogenide material that undergoes a structural change (or changes its electrical properties) during an access operation (e.g., reading, writing). For example, the threshold voltage of the chalcogenide may change based on the polarity of a program pulse (e.g., the polarity of the voltage applied across the chalcogenide). Thus, when the memory material 115 includes chalcogenide, different logic states may be stored by applying voltages of different polarities across a memory cell 105. The logic states may be read from the memory cell 105 by applying a voltage of a fixed polarity across the memory cell 105. Voltage may be applied across a memory cell 105 by applying voltage to the corresponding conductive pillar 120 and electrode plane 110.

In some embodiments, the memory cells 105 may be aligned (e.g., vertically) along a memory column 135. In some embodiments, the memory cells 105 may be aligned in a same plane as one or more associated electrode planes 110. In other embodiments, an entire memory cell 105 or a portion of the memory cell 105 may be aligned in the plane of the electrode plane 110. A memory cell 105 may have a thickness that is equal to or different than (e.g., greater than, less than) a thickness of an electrode plane 110. In some cases, a portion of a memory cell 105 may extend above and/or below the plane of the electrode plane 110.

In some embodiments, the memory material 115 may be selectively deposited in the same plane as the electrode plane 110 to form a memory cell 105 (e.g., the memory material 115 may not extend through the dielectric planes). Aspects of this embodiment are shown as memory column 125. As shown with memory column 125, the memory material 115 may not extend the entire length of the memory column 135 (e.g., may partially extend for a length less than the length of the memory column 135).

The area of a memory cell 105 may be defined as the area of the memory material 115 that intersects with an electrode plane 110 (e.g., the area may be defined as the circumference of the memory cell 105 multiplied by the thickness of the electrode plane 110). Thus, the area of a memory cell 105 may be the area of the outer-surface of the memory cell 105. The current used to program a memory cell 105 may be a function of the area of the memory cell (e.g., the programming current may be proportional to or a function of an area of the memory cell 105). Thus memory cells with smaller areas may require lower programming currents, which may reduce power consumption of the memory array 100.

In some embodiments, conductive pillars 120 and electrode planes 110 may be oriented in different directions (e.g., substantially perpendicular to one another) to create an array. Conductive pillars 120 and electrode planes 110 may be coupled with access lines, which may be conductive lines. Additionally or alternatively, the conductive pillars 120 and electrode planes 110-a may act as access lines (e.g., the conductive pillars 120 may serve as bit lines (BL) and the electrode planes 110 may serve as word lines (WL)). In some embodiments (not shown) electrode planes 110 may be patterned into a plurality of electrode lines whose width may accommodate a single conductive pillar 120 (e.g., each electrode line may accommodate a mono-dimensional plurality of conductive pillars 120).

In general, one memory cell 105 may be located at the intersection of a conductive pillar 120 and an electrode plane 110. This intersection may be referred to as the address of the memory cell 105. A target memory cell 105 may be a memory cell 105 located at the intersection of an energized conductive pillar 120 and electrode plane 110; that is, a conductive pillar 120 and electrode plane 110 may be energized in order to read or write a memory cell 105 at their intersection. Other memory cells 105 that are in electronic communication with the same conductive pillar 120 or electrode plane 110 may be referred to as untargeted memory cells 105.

Access to memory cells 105 may be controlled through a row decoder and a column decoder. For example, a row decoder may receive a row address from a memory controller and activate the appropriate electrode plane 110 based on the received row address. Similarly, a column decoder may receive a column address from the memory controller and activate the appropriate conductive pillar 120. Thus, operations such as reading and writing may be performed on memory cells 105 by activating or selecting a conductive pillar 120 and electrode plane 110, which may include applying a voltage or a current to the respective conductive pillar 120 and/or electrode plane 110. During a write operation, a logic state may be stored at a memory cell 105. During a read operation, the logic state stored at a memory cell 105 may be determined. For example, the memory cell 105 may output a signal that is sensed by a sense component (e.g., a sense amplifier) that determines the stored state of the memory cell 105. The sense component may include various transistors or amplifiers in order to detect and amplify a difference between a reference signal and the signal output from the memory cell 105.

The structures in memory array 100 may be made up of various materials. For example, the conductive pillars 120, electrode cylinders 130, and electrode planes 110 may be made of conductive materials such as metals (e.g., copper (Cu), aluminum (Al), gold (Au), tungsten (W), titanium (Ti), etc.), metal alloys, carbon, conductively-doped semiconductors, or other conductive materials, alloys, or compounds. The electrode plane 110 material may be composed of the same material as the electrode cylinders 130 or a different material. Memory material 115 may be a chalcogenide material (e.g., a chalcogenide glass). For instance, memory material 115 may be a doped or undoped alloy of selenium (Se), arsenic (As), silicon (Si), Tellurium (Te), and germanium (Ge).

As described above, the material for the electrode planes 110 may be materials with low resistivity (or high conductivity), which may facilitate current flow. But materials with low resistivity (or high conductivity) may adversely interact with the chalcogenide in memory material 115. For instance, metals may interact with the chalcogenide at an electron-level or atomic-level in a manner that disrupts operation of the associated memory cell 105. Although higher resistivity/lower conductivity materials may interact less with chalcogenide, use of such materials in the electrode planes 110 may impair current flow, which may negatively impact the performance of the memory array 100. Moreover, electrode planes 110 that are composed of materials with high resistivity (e.g., carbon) may have strong global resistances, which may limit the density of the array 100, the thickness of the electrode planes 110, or lead to other related problems.

According to the techniques described herein, low resistivity (or high conductivity) materials may be used for the electrode planes 110—without incurring adverse chalcogenide interactions—by placing a dielectric barrier 145 between the electrode planes 110 and the memory material 115. The dielectric barrier 145 may be positioned so that it physically separates the electrode planes 110 from the memory material 115. The dielectric barrier 145 may be composed of an insulating or dielectric material that prevents adverse interactions between the electrode planes 110 and the memory material 115. But the dielectric barrier 145 may have a thickness (e.g., be thin enough) to allow current flow so that the operations of the memory cell 105 are still enabled while at the same time preventing adverse interactions. Although a single memory column 125 is shown with a dielectric barrier 145, any number of memory columns 125 may include a dielectric barrier 145.

The ability to use low resistivity materials for the electrode planes 110 may reduce the global resistance of the electrode planes 110, which may enable higher cell density in a memory array. For example, more electrode planes 110 (and thus memory cells 105) can fit into an array by reducing thickness of, or the spacing between, each electrode plane 110. Because the programming current for a memory cell is directly proportional to the area of the memory cell 105, reducing the thickness of the electrode planes 110 may have the additional advantage of reducing the power consumption of the memory array 100. The use of materials with low resistivity for electrode planes 110 may also improve the distribution of current in the electrode planes 110, which may allow a higher number of conductive pillars 120 to share the same electrode plane 110 (thereby increasing the cell density of the array).

In some memory architectures, accessing the memory cell 105 may degrade or destroy the stored logic state and re-write or refresh operations may be performed to return the original logic state to memory cell. In DRAM, for example, the logic-storing component (e.g., a capacitor) may be partially or completely discharged during a sense operation, corrupting the stored logic state. So the logic state may be re-written after a sense operation. But in non-volatile memory, such as self-selecting memory, accessing a memory cell 105 may not destroy the logic state and, thus, the memory cell 105 may not require re-writing after accessing.

Some memory architectures, including DRAM, may lose their stored state over time unless they are periodically refreshed by an external power source. For example, a charged capacitor may become discharged over time through leakage currents, resulting in the loss of the stored information. The refresh rate of these so-called volatile memory devices may be relatively high, e.g., tens of refresh operations per second for DRAM, which may result in significant power consumption. With increasingly larger memory arrays, increased power consumption may inhibit the deployment or operation of memory arrays (e.g., power supplies, heat generation, material limits, etc.), especially for mobile devices that rely on a finite power source, such as a battery. As discussed below, non-volatile self-selecting cells may have beneficial properties that may result in improved performance relative to other memory architectures. For example, self-selecting memory cells may offer comparable read/write speeds as DRAM but may be non-volatile and allow for increased cell density.

A memory controller may control the operation (read, write, re-write, refresh, discharge, etc.) of memory cells 105 through the various components, for example, a row decoder, column decoder, and a sense component. In some cases, one or more of the row decoder, column decoder, and sense component may be co-located with the memory controller. The memory controller may generate row and column address signals in order to activate the desired electrode plane 110 and conductive pillar 120. The memory controller may also generate and control various voltages or currents used during the operation of a memory device that includes array 100.

Figure 2A:
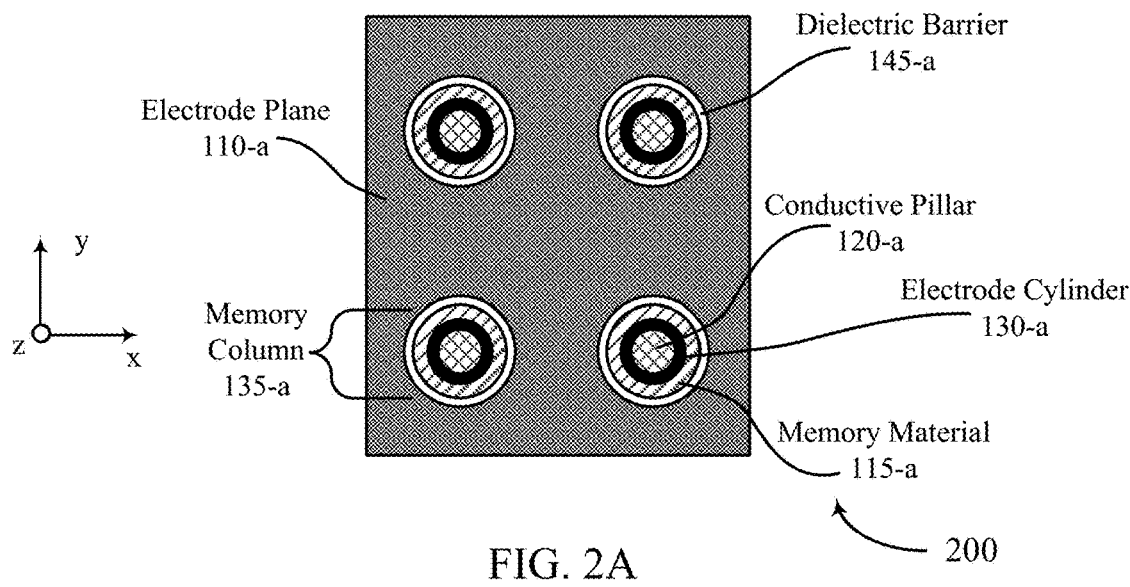
FIG. 2A shows a planar view of a memory array that supports self-selecting memory cells with dielectric barriers in accordance with various embodiments of the present disclosure.

FIG. 2A shows a planar view of a memory array 200 that supports self-selecting memory cells with one or more dielectric barriers. The memory array 200 may be an example of the memory array 100 described with reference to FIG. 1. Memory array 200 may include memory columns 135-a, electrode planes 110-a, and dielectric planes (not shown in the planar view). The electrode planes 110-a and dielectric planes may lie in the x-y plane. Memory columns 135-a may include conductive pillars 120-a, which may be at least partially surrounded by electrode cylinders 130-a (e.g., an electrode material may at least partially surround the conductive pillars 120-a). Electrode cylinders 130-a may be at least partially surrounded by memory material 115-a, which may be in contact with the electrode cylinder 130-a. In some cases, a dielectric barrier 145-a may separate the memory material 115-a from the surrounding plane (e.g., the electrode planes 110-a). The dielectric barrier 145-a may decrease harmful interactions between the memory material 115-a and the material making up the surrounding plane.

Memory columns 135-a may intersect (e.g., perpendicularly, in a non-orthogonal direction) the electrode planes 110-a and the dielectric planes (e.g., memory columns 135-a may extend into the page in the z-direction). The planar view shown in FIG. 2A is from the perspective of an electrode plane 110-a. A planar view shown from the perspective of the dielectric plane would be similar except the electrode plane would be replaced with a dielectric plane (not shown).

The memory columns 135-a may be arranged in a grid and/or other array pattern. In some embodiments, the conductive pillars 120-a may be coupled with memory access lines (e.g., word lines and bit lines). For example, the conductive pillars 120-a may be coupled with bit lines and the electrode planes 110-a may be coupled with word lines. Thus, each electrode plane 110-a may be coupled with a respective word line and each conductive pillar 120-a may be coupled with a respective bit line. Other configurations of coupling memory access lines to the memory array 200 may be used. The access lines may be used to apply voltages to and across memory cells in the memory array 200.

Figure 2B:
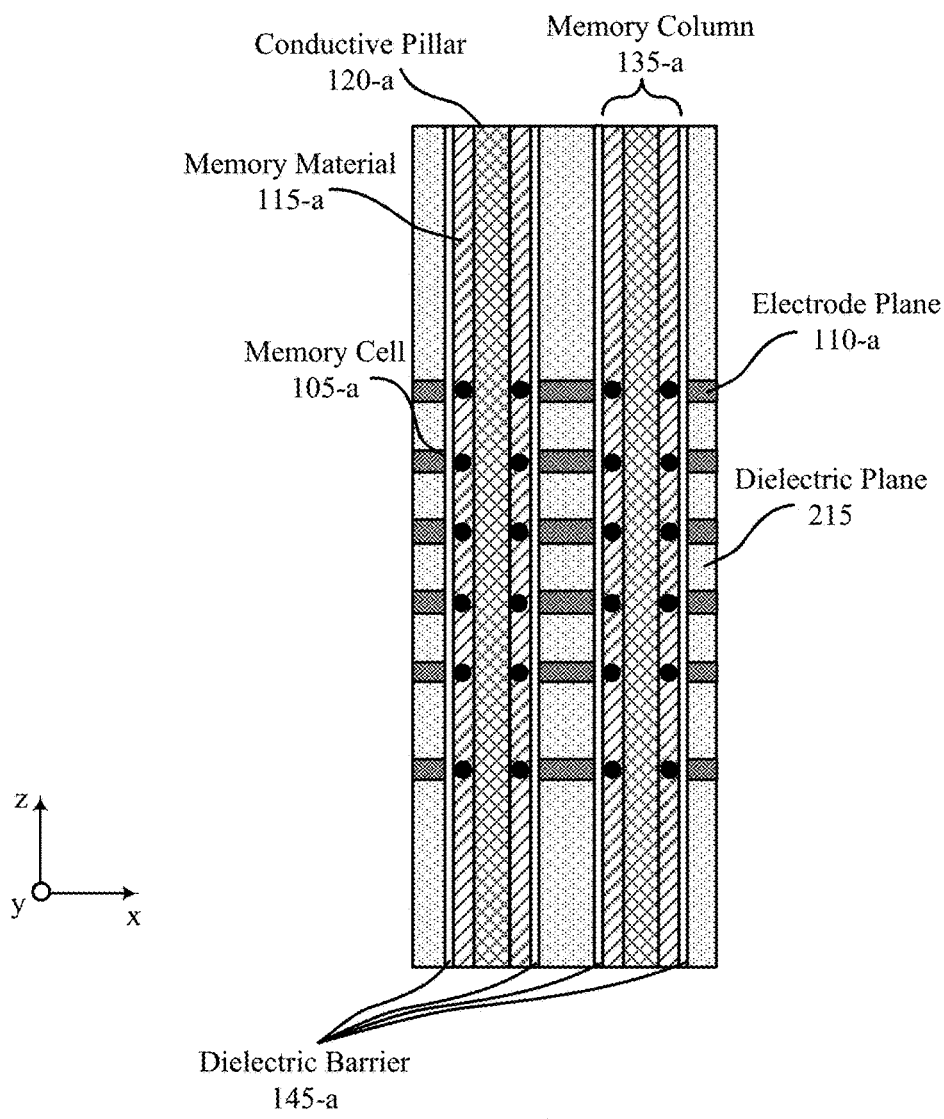
FIG. 2B shows a cross-section view of a memory array that supports self-selecting memory cells with dielectric barriers in accordance with various embodiments of the present disclosure.

FIG. 2B shows a cross-section view of memory array 200. The view shown in FIG. 2B is that of the memory array 200 viewed from the y-direction. Due to the symmetry in the memory array 200, a similar view is seen when the memory array 200 is viewed from the x-direction (unless, for example, electrode plans 110-a are patterned into WLs). As described above, memory columns 135-a may extend in the z-direction, through the stack of electrode planes 110-a and dielectric planes 215. The electrode planes 110-a (e.g., a first set of planes) may be interleaved with the dielectric planes 215 (e.g., a second set of planes) so that they form an alternating pattern (e.g., the electrode planes 110-a may be separated by the dielectric planes 215 and the dielectric planes 215 may be separated by the electrode planes 110-a). Thus, a pair of adjacent electrode planes 110-a may be physically separated by a dielectric plane 215, and a pair of adjacent dielectric planes 215 may be physically separated by an electrode plane 110-a. The electrode planes 110-a and dielectric planes 215 may be parallel to each other. Although shown with six electrode planes 110-a and seven dielectric planes 215, memory array 200 may include any number of different planes and may or may not include electrode planes and/or dielectric planes.

Memory columns 135-a may include a conductive pillar 120-a and memory material 115-a. Memory columns 135-a may also include an electrode cylinder (not shown in the cross-sectional view) between the conductive pillars 120-a and the memory material 115-a. A memory cell 105-a may form in the memory material 115-a at the intersection of each conductive pillar 120-a and electrode plane 110-a. When the memory material 115-a is in the shape of a cylinder, the memory cell 105-a may be ring-shaped. The thickness of the memory cell 105-a may be similar to the thickness of the electrode plane 110-a, or it may be larger or smaller. The distance between successive electrode planes 110-a may prevent the memory cells 105-a from interfering with each other. Memory cells 105-a may also be referred to as memory structures, self-selecting memory structures, memory elements, memory storage elements, or a self-selecting memory storage elements.

The memory material 115-a that forms memory cell 105-a may include a material that has a variable and configurable threshold voltage that is representative of the logic states. A voltage applied across a memory cell 105-a may thus result in different currents depending on the threshold voltage of the memory cell 105-a, and the magnitude of the resulting current may be used to determine the logic state stored by memory cell 105-a. In some cases, the memory material 115-a may be incompatible with the material that makes up the electrode plane 110-a. For instance, the memory material 115-a may interact with the electrode plane material in a manner that disrupts operation of the memory array 200 (e.g., electrons or atoms may diffuse from one material to the other, which may corrupt the logic state stored in the corresponding memory cell 105-a).

According to the techniques described herein, the memory material 115-a may be separated from the electrode planes 110-a by a dielectric material, which may be referred to herein as a dielectric barrier 145-a. The dielectric barrier 145-a may prevent interaction between the electrode planes 110-a and the memory material 115-a while still allowing current to flow through the selected cell (e.g., between the selected electrode plane 110-a and conductive pillar 120-a, and through the memory material 115-a). The dielectric material may prevent or minimize improper electrical communication (e.g., shorting) between the electrode planes 110-a. The dielectric material may also resist material removal processes, such as wet-etching (e.g., the dielectric material may have high selectivity properties). Examples of dielectric materials that can be used to form the dielectric barrier 145-a include allumina, aluminum oxide, silicon oxide, silicon nitride, and zirconium oxide. In some cases, the dielectric material may be the same material that makes up the dielectric planes 215.

To program a memory cell 105-a, programming pulses of different polarities may be applied across the cell 105-a. For example, to program a logic "1" state, a first polarity may be applied and to program a logic "0" state, a second polarity may be applied. The first polarity and the second polarity may be opposite polarities. To read a memory cell 105-a, a voltage may be applied across memory cell 105 and the resulting current or the threshold voltage at which current begins to flow may be representative of a logic "1" or a logic "0" state. A sensing component (e.g., a sense amplifier) may be used to detect the signal (e.g., the current or threshold voltage) output or associated with the memory cell 105-a.

The signal may be compared to a reference signal to determine the logic state stored by the memory cell 105-a.

In some examples, the memory cells 105-a may act as two-terminal threshold switching type devices that control access to the memory cells 105-a. For example, below a threshold voltage, the memory cell 105-a may be "off" and conduct little or no current. Above the threshold voltage, the memory cell 105-a may be "on" and conduct a current and/or a current above the threshold current. The different threshold voltages, which result from reading and writing with particular pulse polarities, may allow the memory cell 105-a to act as both a selection component and a memory element. This may facilitate the use of memory arrays having less complex architectures.

Figure 3:
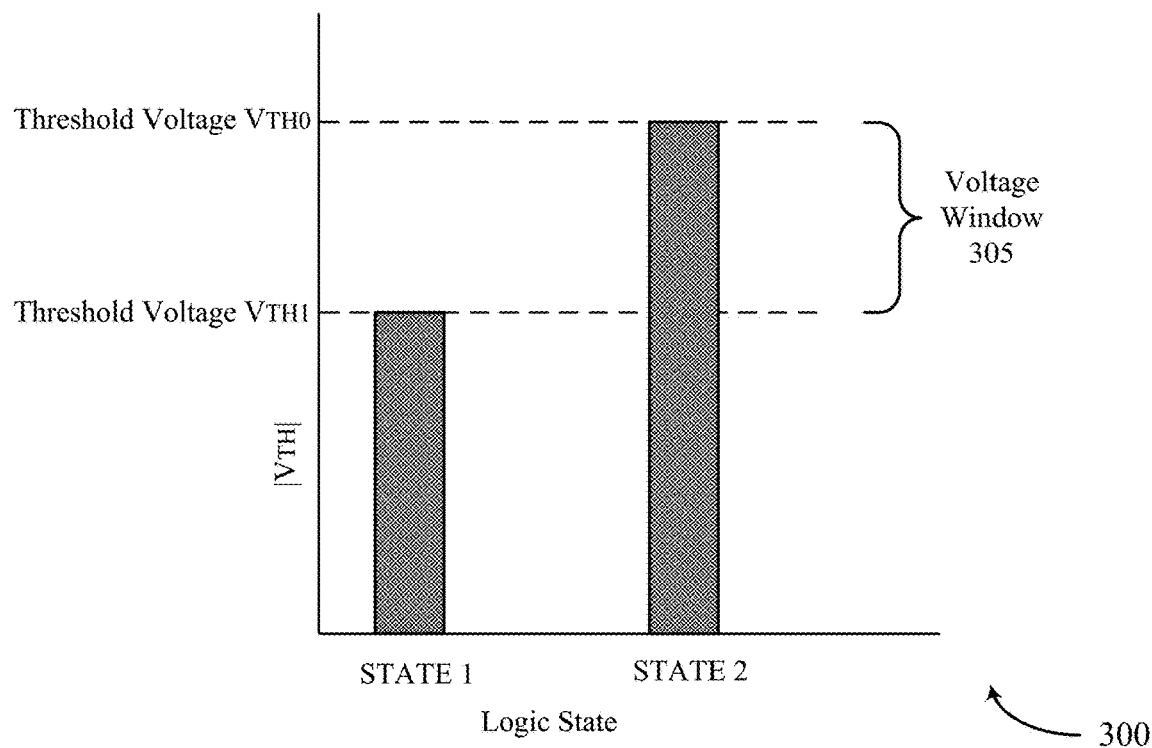
FIG. 3 illustrates a voltage plot of threshold voltages of a self-selecting memory cell with dielectric barrier a that supports features and operations in accordance with examples of the present disclosure in accordance with various embodiments of the present disclosure.

FIG. 3 illustrates a voltage plot 300 of threshold voltages of a self-selecting memory cell with a dielectric barrier that supports features and operations in accordance with examples of the present disclosure. The voltage plot 300 shows the absolute value of threshold voltages ($V_{TH}$) of a memory cell for different logic states. For example, threshold voltage $V_{TH1}$ may be the threshold voltage of the memory cell when it stores a second logic state (e.g., logic state 1, which may refer to a logic "1"). And threshold voltage $V_{TH0}$ may be the threshold voltage of the memory cell when it stores a first logic state (e.g., logic state 2, which may refer to a logic "0"). The threshold voltages may be the threshold voltages of the memory cell when it is accessed for a read operation (e.g., the threshold voltages may be the threshold voltages measured or sensed by a sense component during a read). The voltage applied across a memory cell during a read operation may be referred to herein as a read voltage and the voltage applied across the memory cell during a write operation may be referred to herein as a write voltage. Write and read voltages may be applied by applying voltages to the conductive cylinder and electrode plane of a memory cell so that a voltage difference develops across the associated memory cell.

The threshold voltage of a memory cell may vary based on the polarity of the read voltage relative to the polarity of the write voltage. For example, $V_{TH1}$ may result when the write voltage and the read voltage have the same polarity (e.g., when the write voltage and read voltage are both positive or both negative), and $V_{TH0}$ may result when the write voltage and read voltage have opposite polarities (e.g., when one of the voltages is negative and the other is positive). A positive polarity may be referred to herein as a forward polarity and a negative polarity may be referred to herein as a reverse polarity. Accordingly, $V_{TH1}$ may result when a memory cell is written to in a forward polarity and read from in a forward polarity, or when the memory cell is written to in a reverse polarity and read from in a reverse polarity. And $V_{TH0}$ may result when a memory cell is written to in a forward polarity and read from in a reverse polarity, or written to in a reverse polarity and read from in a forward polarity. Thus, different logic states can be stored at a memory cell by varying the polarity of the write voltage and using the same read voltage polarity for each read operation. In some cases, the read voltage applied to a memory cell may be an intermediate voltage between $V_{TH1}$ and $V_{TH0}$.

The difference between threshold voltage $V_{TH0}$ and threshold $V_{TH1}$ may be referred to as the voltage window 305. The voltage window 305 may be inversely proportional to the area of the memory cell (e.g., memory cells with smaller areas may have larger voltage windows compared to memory cells with larger areas). As discussed above, a memory array with dielectric barriers may operate with electrode planes 110 that are less resistive and/or thick than a memory array without dielectric barriers. Because the voltage window 305 for a memory cell is inversely proportional to the area of the memory cell 105, reducing the thickness of the electrode planes 110 may have the additional advantage of increasing the voltage window 305 for a memory cell 105, which may increase the reliability of the memory cell 105.

In some cases, voltage may be applied to memory cells that are not targeted by an access operation (e.g., unaddressed memory cells). For example, an inhibit voltage may be applied to memory cells that share an electrode plane with a targeted memory cell. The inhibit voltage may reduce the disturbance experienced by the untargeted memory cells when the targeted memory cell is accessed for an operation.

Figure 4:
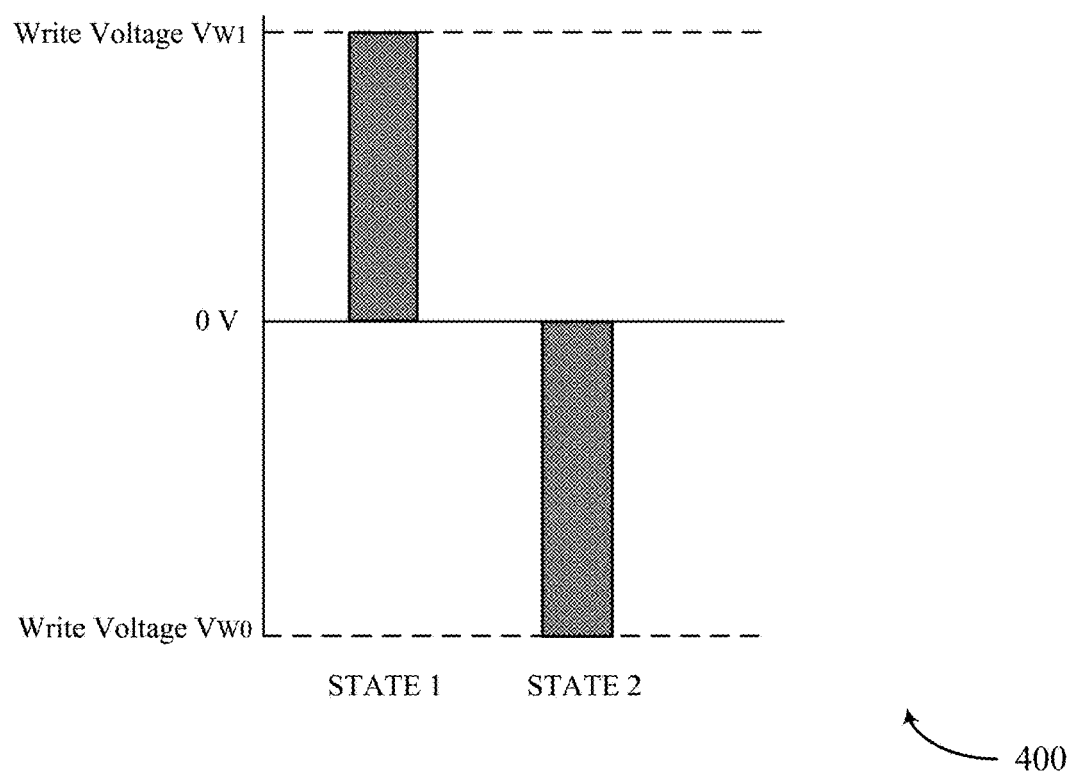
FIG. 4 illustrates a voltage plot of write voltages used to program a self-selecting memory cell with a dielectric barrier that supports features and operations in accordance with examples of the present disclosure in accordance with various embodiments of the present disclosure.

FIG. 4 illustrates a voltage plot 400 of write voltages used to program a self-selecting memory cell with a dielectric barrier that supports features and operations in accordance with examples of the present disclosure. The voltage plot 400 shows the value of write voltages ($V_W$) used to write different logic state to a memory cell. For example, a first write voltage $V_{W1}$ with a first polarity (e.g., a positive polarity) may be used to store a first logic state (logic state 1, which may refer to a logic "1") at the memory cell. And a second write voltage $V_{W0}$ with an opposite polarity (e.g., a negative polarity) may be used to store a second logic state (e.g., logic state 2, which may refer to a logic "0") at the memory cell. The write voltages $V_{W1}$ and $V_{W0}$ may have the same magnitude or different magnitudes. The magnitudes of the write voltages may be selected to be greater than or equal to the greater of threshold voltages $V_{TH0}$ and $V_{TH1}$. The write voltages (and the read voltages) may be applied in a pulse (e.g., the write voltages may be applied in write pulses that have a duration of r ns and the read voltages may be applied in read pulses that have a duration of t ns). In some cases, the duration of the write pulses and the read pulses are the same.

A write voltage may be applied by providing a first voltage to the conductive pillar of a memory cell and a second voltage to the electrode plane of the memory cell. The difference between the two voltages is the voltage applied across the memory cell. A write voltage may have a positive polarity or a negative polarity. For instance, write voltage $V_{W1}$ may have a positive polarity (e.g., write voltage $V_{W1}$ may be $+V_P$, which may be realized by applying $V_P$ to the conductive cylinder and 0V to the electrode plane, or by applying 0V to the conductive pillar and $-V_P$ to the electrode plane, etc.). And write voltage $V_{W0}$ may have a negative polarity (e.g., write voltage $V_{W0}$ may be $-V_P$, which may be realized by applying $-V_P$ to the conductive pillar and 0V to the electrode plane, or by applying 0V to the conductive pillar and $V_P$ to the electrode plane, etc.). The polarity of the read voltage may be the same for each read operation (e.g., the read voltage may be $+V_R$ for each read operation or $-V_R$ for each read operation).

Figure 5:
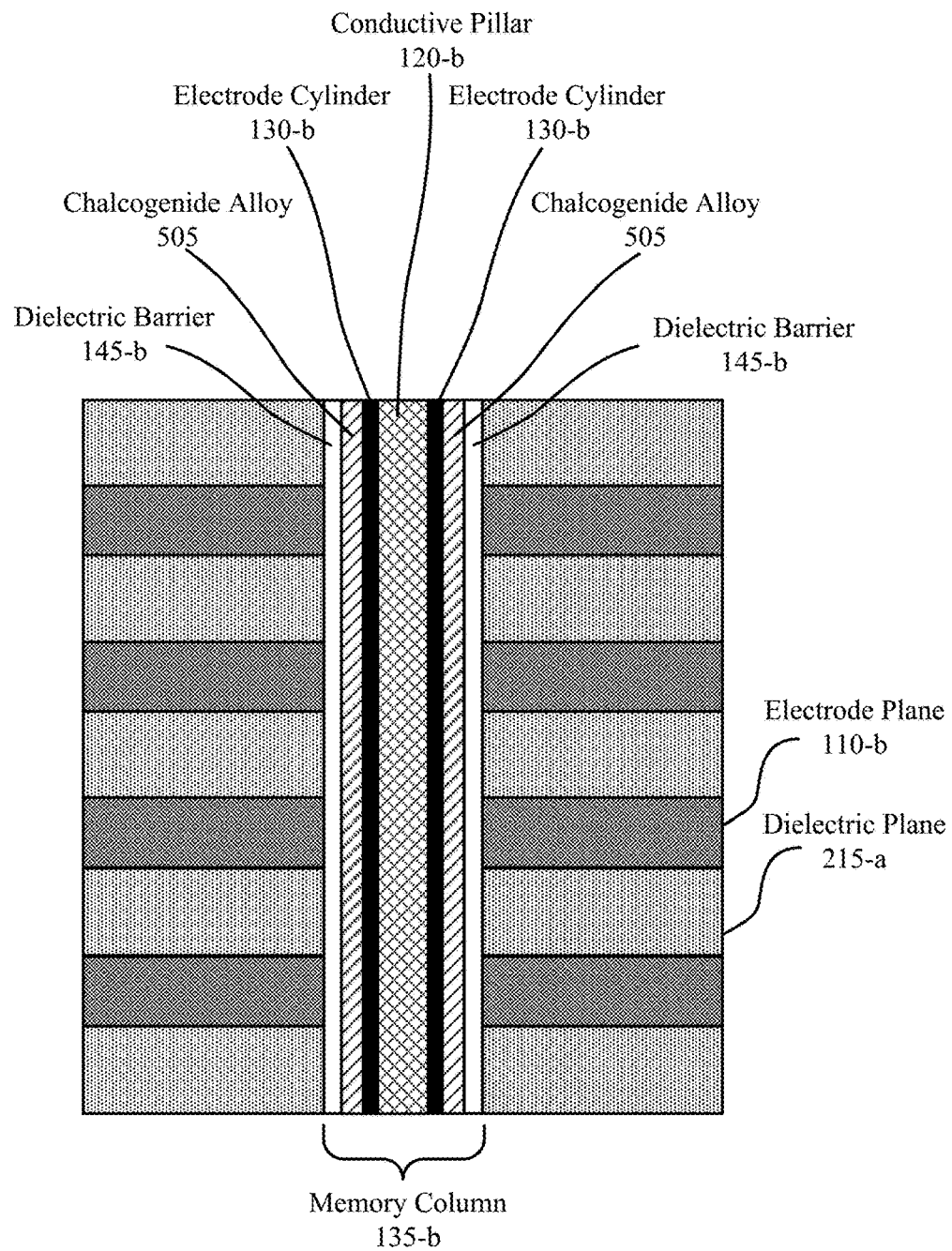
FIG. 5 illustrates a memory array that supports self-selecting memory cells with dielectric barriers in accordance with various embodiments of the present disclosure.

FIG. 5 illustrates a memory array 500 that supports self-selecting memory structures with dielectric barriers. Memory array 500 may include electrode planes 110-b, which may be a first set of planes or other structures, and dielectric planes 215-a, which may be a second set of planes or other structures. Electrode planes 110-b may form conductive planes (e.g., layers) and dielectric planes 215-a may form insulating planes (e.g., layers). Electrode planes 110-b may be interleaved with dielectric planes 215-a in an alternating pattern referred to as a memory stack, stack, or stack of planes. A stack may include at least a first conductive plane (e.g., an electrode plane 110-b) and a second plane (e.g., a dielectric plane 215-a made up of a dielectric material). Electrode planes 110-*b* may be composed of a conductive material and dielectric planes 215-*a* may be composed of a dielectric or insulating material (thus, the first set of planes may be composed of a first material and the second set of planes may be composed of a second material different than the first material).

A memory column 135-*b* may be disposed through at least a portion of the stack so that it is in contact with and intersects the electrode planes 110-*b* and the dielectric planes 215-*a*. A conductive pillar 120-*b* may be at the center of, and run the length of, the memory column 135-*b*. Thus, the conductive pillar 120-*b* may also be disposed through at least a portion of the stack. An electrode cylinder 130-*b* may include electrode material and may at least partially surround the conductive pillar 120-*b* so that the electrode cylinder is in contact with the conductive pillar 120-*b* (e.g., the electrode material may circumferentially wrap around or encapsulate the conductive pillar 120-*b*). Similarly, a chalcogenide alloy 505 may include a chalcogenide alloy material that surrounds the electrode cylinder 130-*b* so that the chalcogenide alloy 505 is in contact with the electrode cylinder 130-*b* (e.g., the chalcogenide alloy material may circumferentially wrap around or encapsulate the electrode cylinder 130-*b*). Thus, the electrode material of the electrode cylinder 130-*b* may be in contact with the chalcogenide alloy material of the chalcogenide alloy 505. The electrode material of the electrode cylinder 130-*b* may also be in contact with the conductive pillar 120-*b*). Although not in contact with the conductive pillar 120-*b*, the chalcogenide alloy 505 may at least partially surround the conductive pillar 120-*b*. The chalcogenide alloy 505 may be an example of a memory material 115 discussed with reference to FIGS. 1, 2A, and 2B. Although shown as a cylinder, the electrode cylinder 130-*b* may be any shape.

A dielectric barrier 145-*b* may separate the chalcogenide alloy 505 from the electrode planes 110-*b* and the dielectric planes 215-*a*. For example, the dielectric barrier 145-*b* may at least partially surround the chalcogenide alloy 505 (e.g., the dielectric material may circumferentially surround the chalcogenide alloy 505 so that the chalcogenide alloy 505 is in contact with the dielectric barrier 145-*b*). Thus, the dielectric barrier 145-*b* may be disposed through and in contact with at least one electrode plane 110-*b* (e.g., a first conductive plane) and at least one dielectric plane 215-*a* (e.g., a second plane). The dielectric barrier 145-*b* may separate the chalcogenide alloy material of the chalcogenide alloy 505 from at least one electrode plane 110-*b* (e.g., a first plane) and at least one dielectric plane 215-*a* (e.g., a second plane). In some cases, the dielectric barrier 145-*b*, the chalcogenide alloy 505, and the electrode cylinder 130-*b* are concentric cylinders.

In some embodiments, the dielectric barrier 145-*b* may be in contact with both the chalcogenide alloy 505 and the planes in the stack. In some cases, e.g., when the chalcogenide alloy 505 is selectively deposited in the same plane as the electrode planes 110-*b* (as shown in memory column 125 in FIG. 1), the dielectric barrier 145-*b* may also be selectively deposited in the same plane as the electrode plane 110-*b*. Thus, in such cases, the dielectric barrier 145-*b* may be in radial contact with the chalcogenide alloy 505 and the electrode planes 110-*b*, but not the dielectric plane 215-*a*. Regardless of deposition technique, the dielectric barrier 145-*b* may physically separate the chalcogenide alloy 505 and the electrode planes 110-*b* so that interactions between the chalcogenide alloy 505 and the electrode plane 110-*b* are prevented, which may improve the operation of the memory array 500.

Figure 6A:
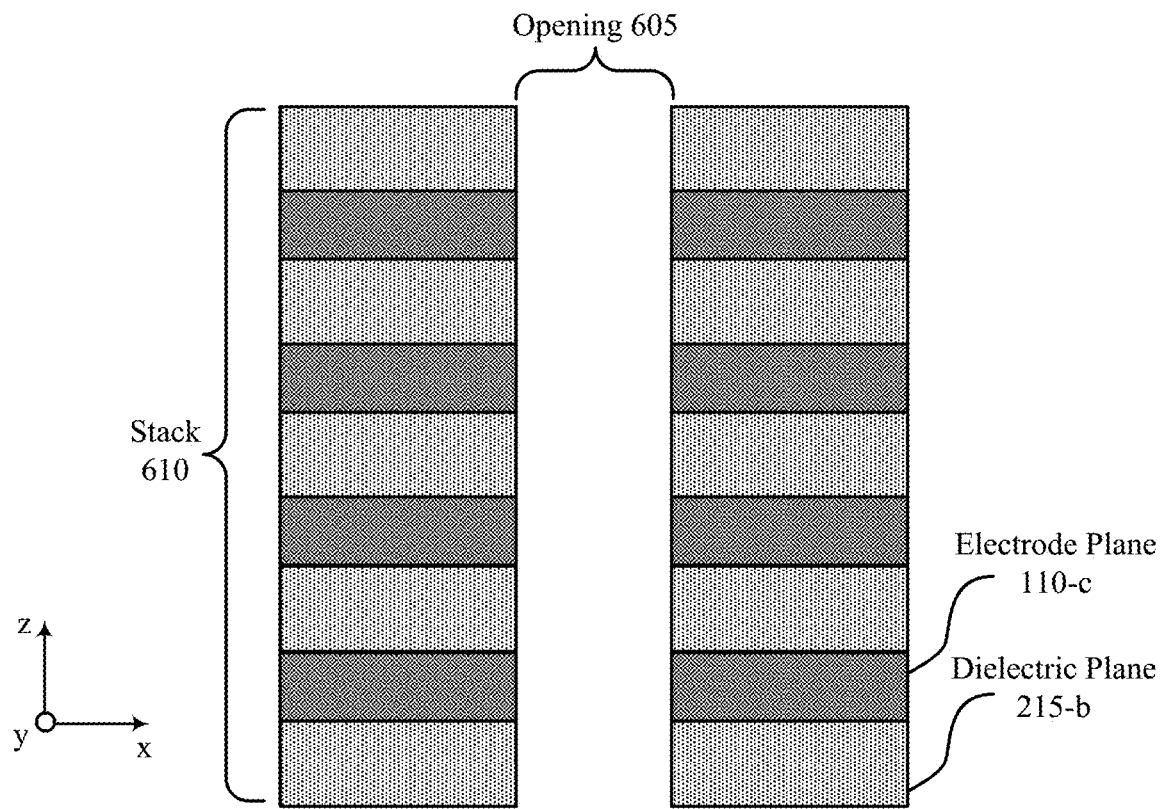
FIGS. 6A and 6B illustrate a memory array during various steps in a first fabrication process in accordance with various embodiments of the present disclosure.
Figure 6A:
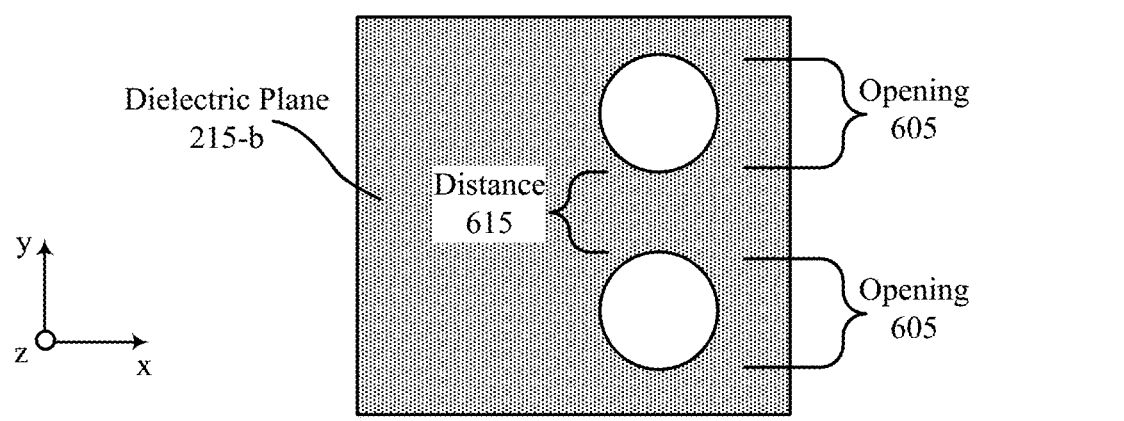

FIG. 6A illustrates a memory array 600-*a* during a step in a first fabrication process. Memory array 600-*a* may be an example of a memory array 100, 200, or 500 described with respect to FIGS. 1, 2A, 2B and 5, respectively. Memory array 600-*a* may be formed by depositing alternating layers of conductive material and dielectric material. The conductive material may be deposited so that it forms electrode planes 110-*c* (e.g., horizontal planes) and the dielectric material may be deposited so that it forms dielectric planes 215-*b* (e.g., horizontal planes). Thus, a first electrode plane 110-*c* (e.g., a first conductive plane) may be in contact with a top side of a dielectric plane 215-*b* (e.g., a second plane), and a second electrode plane 110-*c* (e.g., a second conductive plane) may be in contact with a bottom side of the dielectric plane 215-*b*. Similarly, a first dielectric plane 215-*b* may be in contact with a top side of an electrode plane 110-*c*, and a second dielectric plane 215-*b* may be in contact with a bottom side of the electrode plane 110-*c*. The electrode planes 110-*c* may be formed of conductive materials such as metal or polysilicon and the dielectric planes 215-*b* may be formed of an oxide or other insulating material. The electrode planes 110-*c* and the dielectric planes 215-*b* may be formed as layers of thin films.

After the alternating layers of electrode planes 110-*c* and dielectric planes 215-*b* have been formed as a stack 610, openings 605 may be formed (e.g., via etching, milling, etc.) through the stack 610. The openings 605 may be formed so that they intersect the electrode planes 110-*c* and the dielectric planes 215-*b*. For example, if the electrode planes 110-*c* and dielectric planes 215-*b* extend in the x-y plane, the openings 605 may extend in the z-direction, as seen in the cross-section view. Thus, the opening 605 may expose portions or sections of the electrode planes 110-*c* and the dielectric planes 215-*b*. The footprints of the openings 605 may be circular or any other shape. When the footprint of opening 605 is circular, the opening 605 may form a cylindrical hole in the stack 610. As seen in the planar view, the openings 605 may be separated from each other by a distance 615 so that when the memory array 600-*a* is completed, operations of memory cells in different openings 605 do not interfere with each other.

Various techniques may be used to form the materials, structures, or openings of memory array 600-*a* and other memory arrays described herein. These techniques may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed from memory array 600-*a* using a number of techniques, which may include, for example, chemical etching (also referred to as "wet etching"), plasma etching (also referred to as "dry etching"), or chemical-mechanical planarization.

Figure 6B:
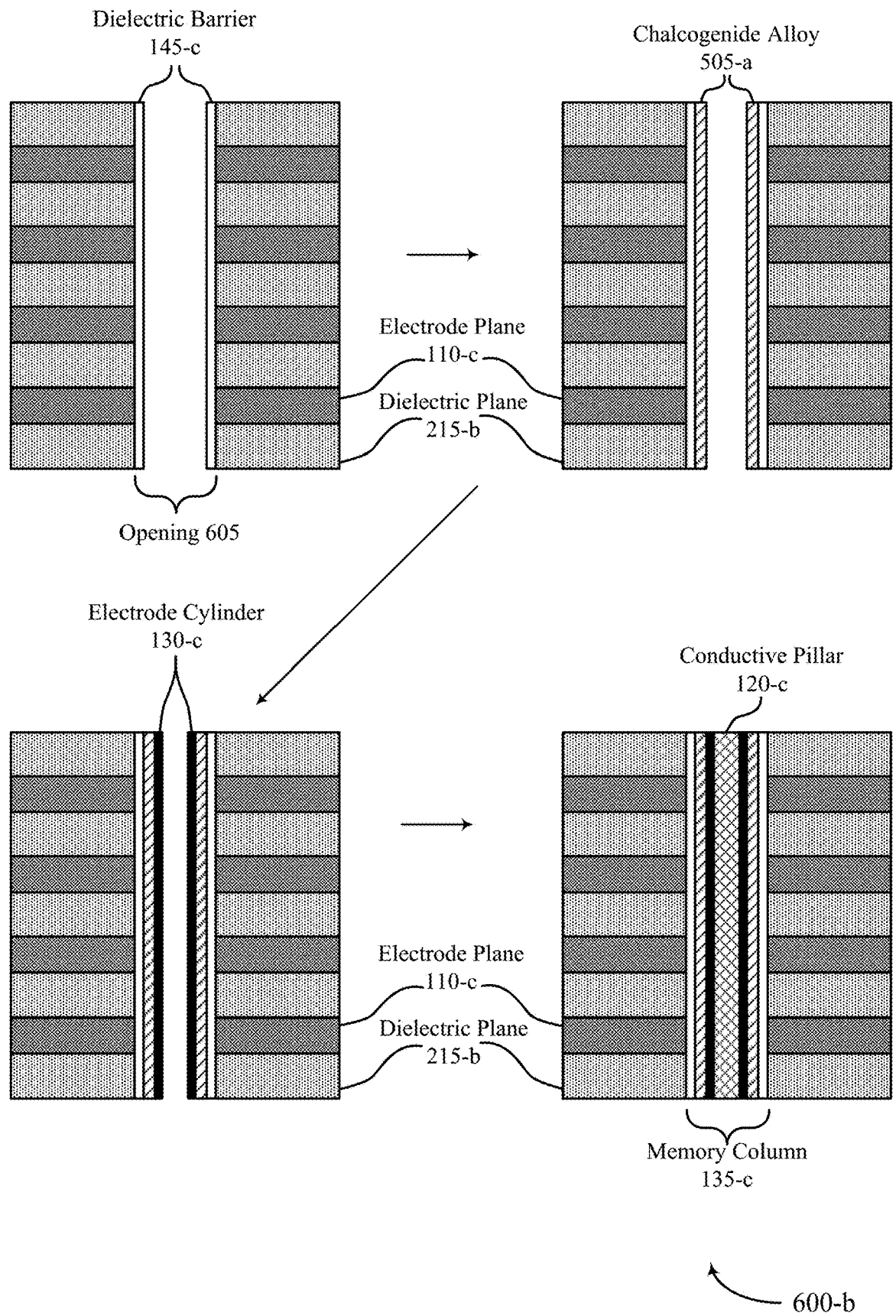

FIG. 6B illustrates a memory array 600-*b* during various steps in the first fabrication process. Memory array 600-*b* may be an example of a memory array 600-*a* during subsequent steps in the first fabrication process. Memory array 600-*b* may be formed by depositing materials within opening 605 of memory array 600-*a*. For instance, a dielectric material may be deposited or formed within the opening 605 so that the dielectric material is in contact with (e.g., overlaps, covers) the portions of the stack exposed by the opening 605 (e.g., so that the dielectric material is in contact with the electrode planes 110-*c* (a first set of planes) and the dielectric planes 215-*b* (a second set of planes)). The dielectric material may form a dielectric barrier 145-*c* (e.g., the dielectric barrier 145-c may be disposed vertically through, and in contact with, the electrode planes 110-c and dielectric planes 215-b). In some cases, the dielectric barrier 145-c may form a hollow structure (e.g., cylinder) with an exterior surface that is in contact with at least some of the electrode planes 110-c and dielectric planes 215-b exposed by the opening 605.

In some embodiments, the thickness of the dielectric barrier 145-c may be on the nanometer scale (e.g., between 0.5 and 10 nm). The dielectric barrier 145-c may be thick enough that interactions between the chalcogenide alloy 505-a and the electrode cylinder 130-c are prevented, but thin enough to allow current to pass through the dielectric barrier 145-c. In some cases, the dielectric material may be deposited so that it fills the opening 605. In such cases, a new opening may be formed in the dielectric material so that another material can be deposited within dielectric barrier 145-c. Dielectric barrier 145-c may, in some embodiments, include allumina, aluminum oxide, silicon oxide, silicon nitride, zirconium oxide, or a combination thereof.

After the dielectric barrier 145-c has been formed, a chalcogenide alloy material may be deposited within the opening so that the chalcogenide alloy material is in contact with (e.g., coats or overlaps) the dielectric barrier 145-c. The chalcogenide alloy material may form chalcogenide alloy 505-a, which may be physically separated from the electrode planes 110-c and dielectric planes 215-b by the dielectric barrier 145-c. The dielectric barrier 145-c may prevent interactions between the chalcogenide alloy 505-a and the electrode planes 110-c. In some cases, the chalcogenide alloy 505-a may form a hollow cylinder with an exterior surface that is in contact with the interior surface of dielectric barrier 145-c. In some cases, the chalcogenide alloy material may be deposited so that it at least partially fills the opening in dielectric barrier 145-c. In such cases, a new opening may be formed in the chalcogenide material to form chalcogenide alloy 505-a.

After chalcogenide alloy 505-a is formed, an electrode material may be deposited within the opening in chalcogenide alloy 505-a so that the electrode material is in contact with (e.g., coats or overlaps) the chalcogenide alloy 505-c. The electrode material may form an electrode cylinder 130-c. The exterior surface of electrode cylinder 130-c may be in contact with the interior surface of the chalcogenide alloy 505-a. In some cases, the electrode material may be deposited so that it fills the opening in the chalcogenide alloy 505-a. In such cases, a new opening may be formed in the electrode material so that different material may be deposited within electrode cylinder 130-c. In some cases, the electrode material is the same material that forms the electrode planes 110-c.

After electrode cylinder 130-c is formed, a conductive material may be deposited within the opening in electrode cylinder 130-c. The conductive material may be in contact with (e.g., coat, overlap) the electrode material of electrode cylinder 130-c and may form a conductive pillar 120-c. The conductive pillar 120-c may be a solid column with an exterior surface that is in contact with the interior surface of the electrode cylinder 130-c. The conductive pillar 120-c, electrode cylinder 130-c, chalcogenide alloy 505-a, and dielectric barrier 145-c may form a memory column 135-c.

In some cases, memory column 135-c may be formed by depositing materials in a different order than shown in FIG. 6B. Although the order of depositing material may vary, the final memory column 135-c may include a conductive pillar 120-c, chalcogenide alloy 505-a, and dielectric barrier 145-d (and optionally electrode cylinder 130-c, in some embodiments). In some cases, the memory column 135-c may include a second dielectric barrier with an exterior surface that is in contact with the interior surface of the chalcogenide alloy 505-a.

Figure 7A:
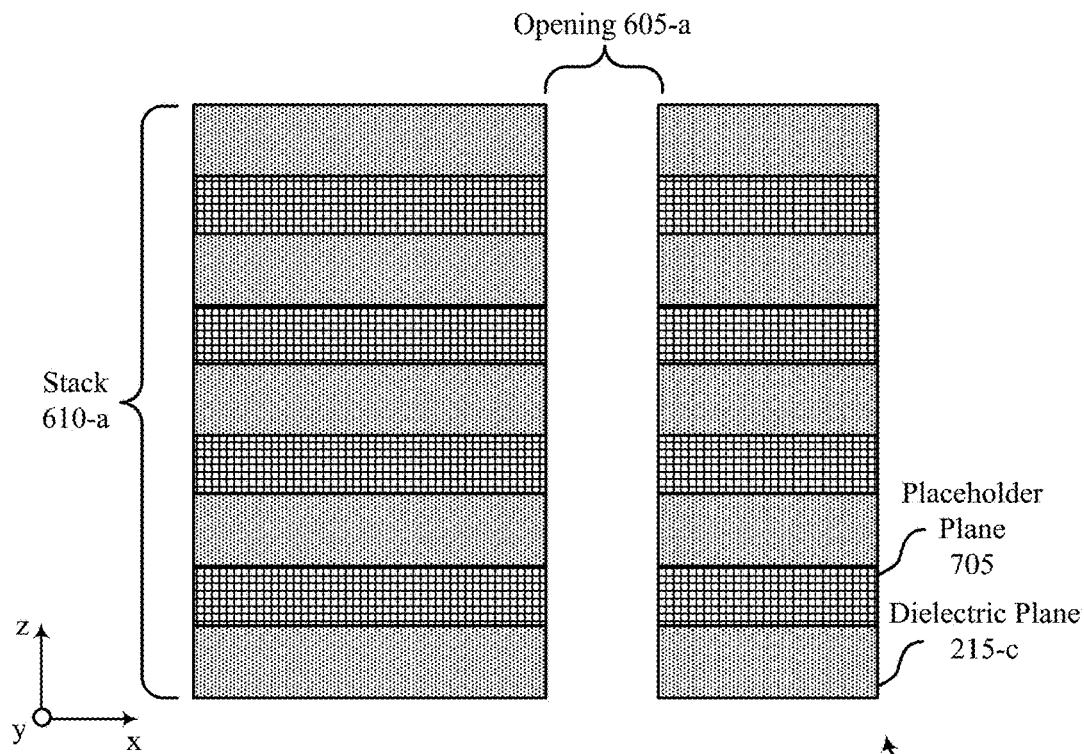
FIGS. 7A through 7F illustrate a memory array during various steps in a second fabrication process in accordance with various embodiments of the present disclosure.

FIG. 7A illustrates a memory array 700-a during a step in a second fabrication process. Memory array 700-a may be an example of a memory array 100, 200, 500, or 600 described with respect to FIGS. 1, 2A, 2B, 5, 6A, and 6B respectively. Memory array 700-a may be formed by depositing alternating layers of placeholder material and dielectric material. The placeholder material may be a material that is compatible with the dielectric material and susceptible to removal processes such as wet-etching (e.g., polysilicon, silicon nitride, etc.). In some cases, the placeholder material is the same material used to form the electrode cylinder (e.g., carbon or silicon).

The placeholder material may be deposited so that it forms horizontal placeholder planes 705 and the dielectric material may be deposited so that it forms horizontal dielectric planes 215-c interleaved with placeholder planes 705. After the alternating layers of placeholder planes 705 and dielectric planes 215-c have been formed as a stack 610-a, one or more openings 605-a may be formed (e.g., via etching, milling, etc.) through the stack 610-a (e.g., the opening 605-a may form a vertical hole). Each opening 605-a may be formed so that it intersects the placeholder planes 705 and the dielectric planes 215-c. An opening 605-a may expose portions or sections of the placeholder planes 705 and the dielectric planes 215-c.

Figure 7B:
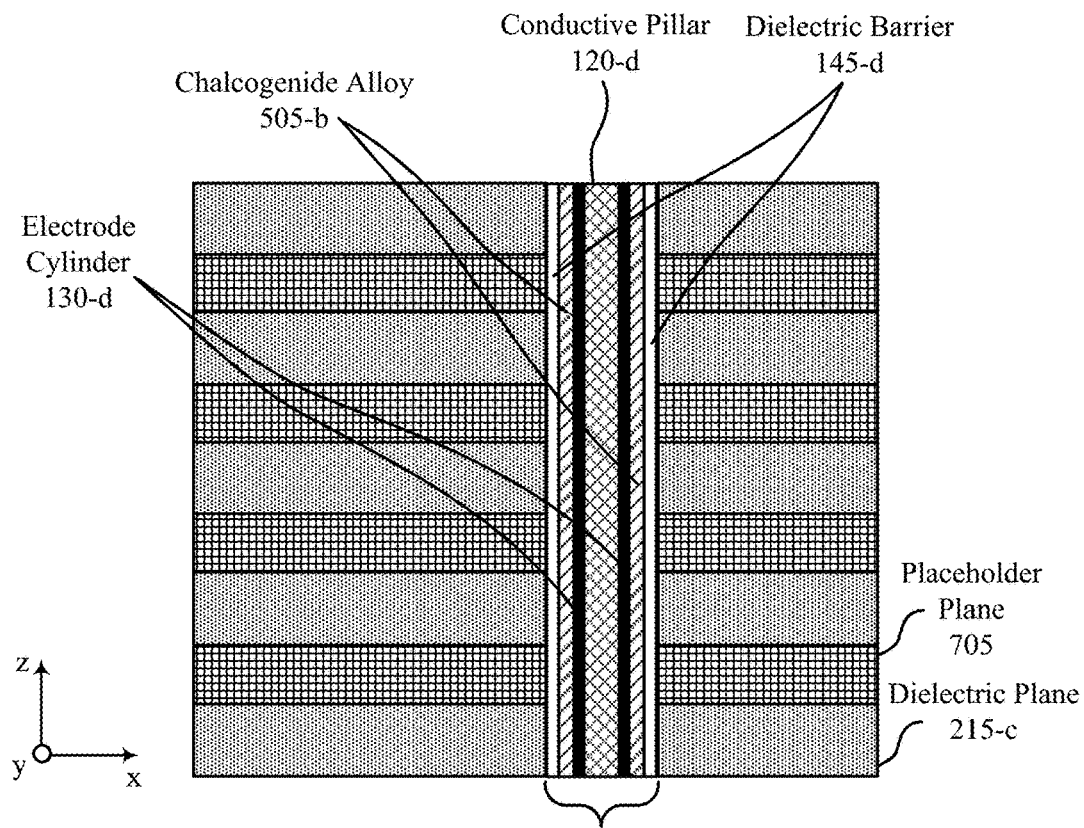

FIG. 7B illustrates a memory array 700-b during a step in the second fabrication process. Memory array 700-b may be an example of a memory array 700-a during a subsequent step in the second fabrication process. Memory array 700-b may be formed by depositing materials within opening 605-a of memory array 700-a, such as described with respect to FIG. 6B. For example, memory array 700-b may include memory column 135-d that includes a conductive pillar 120-d surrounded by electrode cylinder 130-d, chalcogenide alloy 505-b, and dielectric barrier 145-d.

Figure 7C:
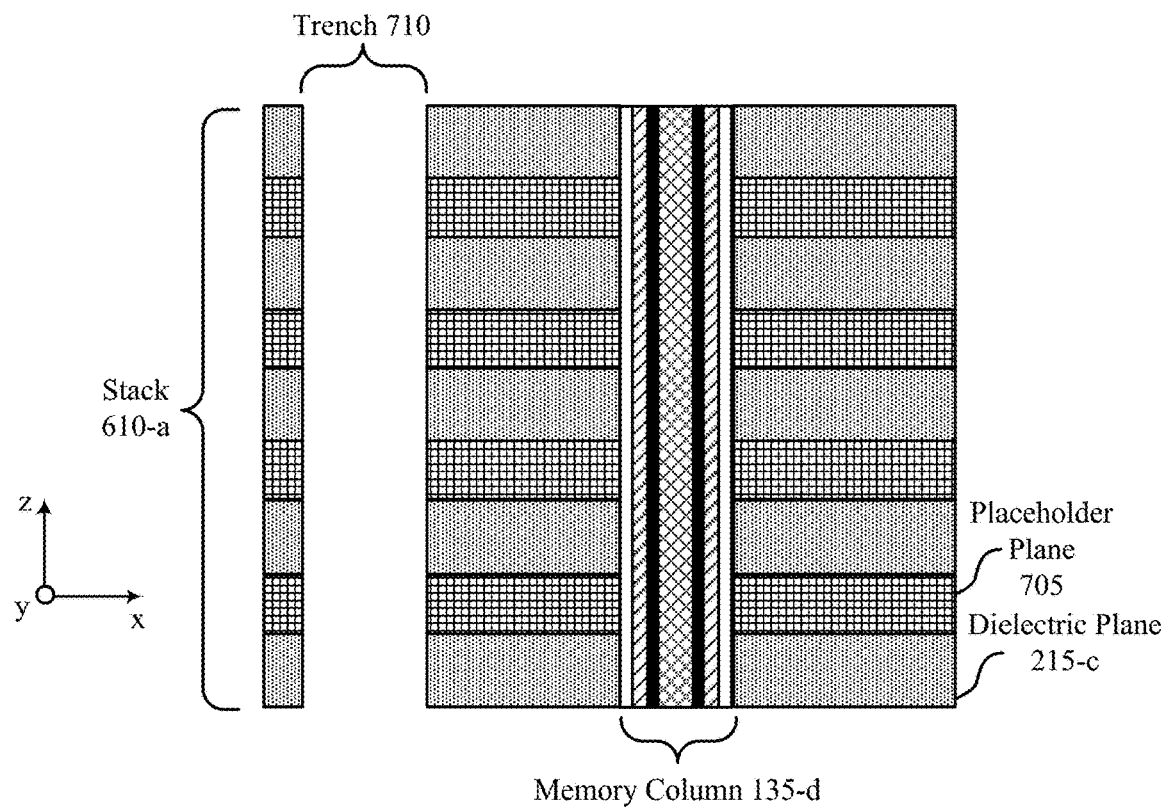
Figure 7C:
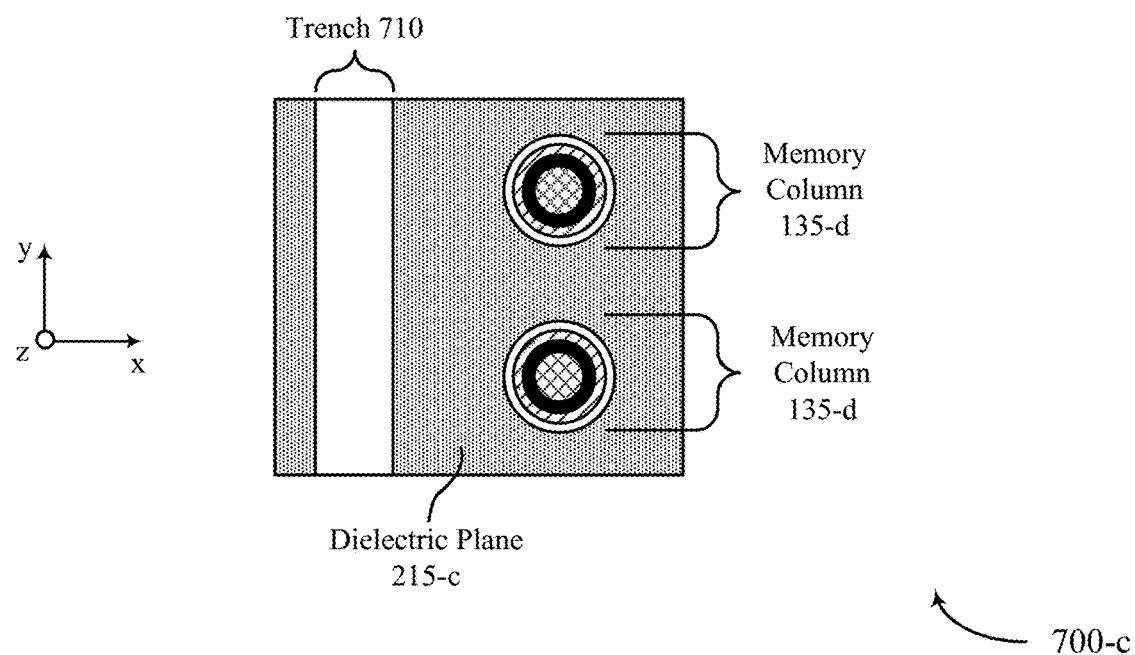

FIG. 7C illustrates a memory array 700-c during a step in the second fabrication process. For example, memory array 700-c may be an example of a memory array 700-b during a subsequent step in the second fabrication process. Memory array 700-c may be formed by forming a trench 710 (or "shunt") through the stack 610-a. The trench 710 may extend vertically through the planes in stack 610-a (e.g., the trench 710 may extend in the z-direction). The trench 710 may also extend in the x-direction and the y-direction, as seen in the planar view. Thus, the trench 710 may have a width, length, and depth. The trench 710 may provide access to the placeholder planes 705 so that the placeholder material in the placeholder planes can be replaced with a different material. In some cases, the trench 710 may be at the edge of the memory array 700-c. In some cases, multiple trenches 710 may be used to provide access to the placeholder planes 705. Although shown with a rectangular footprint, a trench 710 may have a footprint of any shape.

Figure 7E:
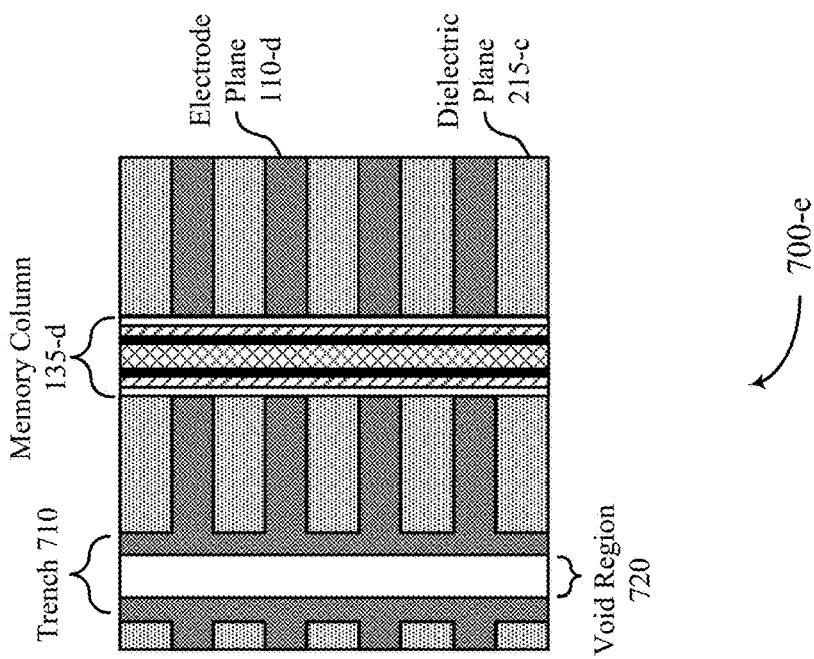
Figure 7D:
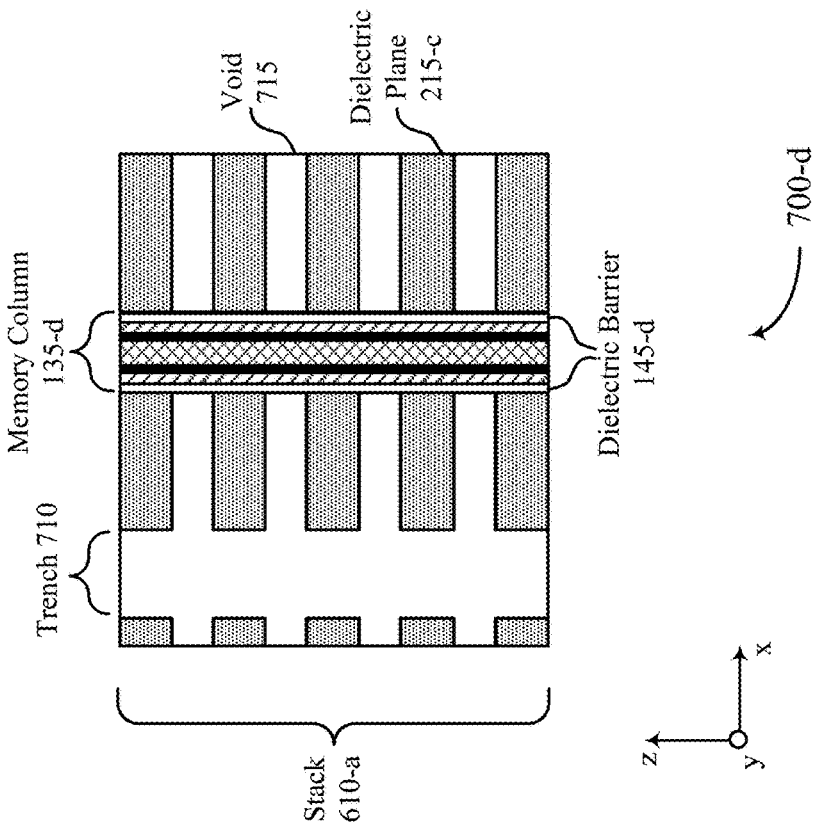

FIG. 7D illustrates a memory array 700-d during a step in the second fabrication process. For example, memory array 700-d may be an example of a memory array 700-c during a subsequent step in the second fabrication process. Memory array 700-d may be formed by removing (e.g., via wet-etching or dry-etching) the placeholder material from the placeholder planes 705 to form voids 715. Thus, the placeholder planes 705 may be removed from the stack 610-a. The voids 715 may have the same shape as the placeholder planes 705. The dielectric material in dielectric barrier 145-d may withstand the removal process so that dielectric barrier 145-*d* is intact after the placeholder material has been removed.

FIG. 7E illustrates a memory array 700-*e* during a step in the second fabrication process. For example, memory array 700-*e* may be an example of a memory array 700-*d* during a subsequent step in the second fabrication process. Memory array 700-*e* may be formed by depositing (e.g., by conformal deposition) a conductive material in the voids 715 so that the voids 715 are at least partially filled with the conductive material. The conductive material may form electrode planes 110-*d*. Thus, the electrode planes 110-*d* may be formed in the voids 715 left by the removed placeholder planes 705 by replacing the placeholder material with the conductive material (e.g., a material that is more conductive than the placeholder material). In some cases, the conductive material fills a portion or all of the trench 710. For example, the conductive material may at least partially line the trench 710 to form a void region 720, which may assist with subsequent removal of the conductive material (e.g., by wet-etch).

To prevent electrode planes 110-*d* from shorting together, the trench 710 may be at least partially filled with a different material (e.g., the dielectric material that makes up dielectric planes 215-*c*, or another insulating material) so that the electrode planes 110-*d* are separated from each other. In some cases, the insulating material may be deposited so that the entire trench 710 is filled with the insulating material. In these cases, the final version of the memory array 700-*e* may include a trench 710 filled with a material different than the conductive material in electrode planes 110-*d*. Thus, a vestigial or residual structure may be left in the memory array 700-*e*. In other cases, the insulating material may be deposited so that only sections of the trench 710 are filled with the insulating material. For example, the insulating material may be formed or deposited in one or more sections of trench 710. Thus, at least a portion of the conductive material in the trench 710 may be replaced by a dielectric material.

Figure 7F:
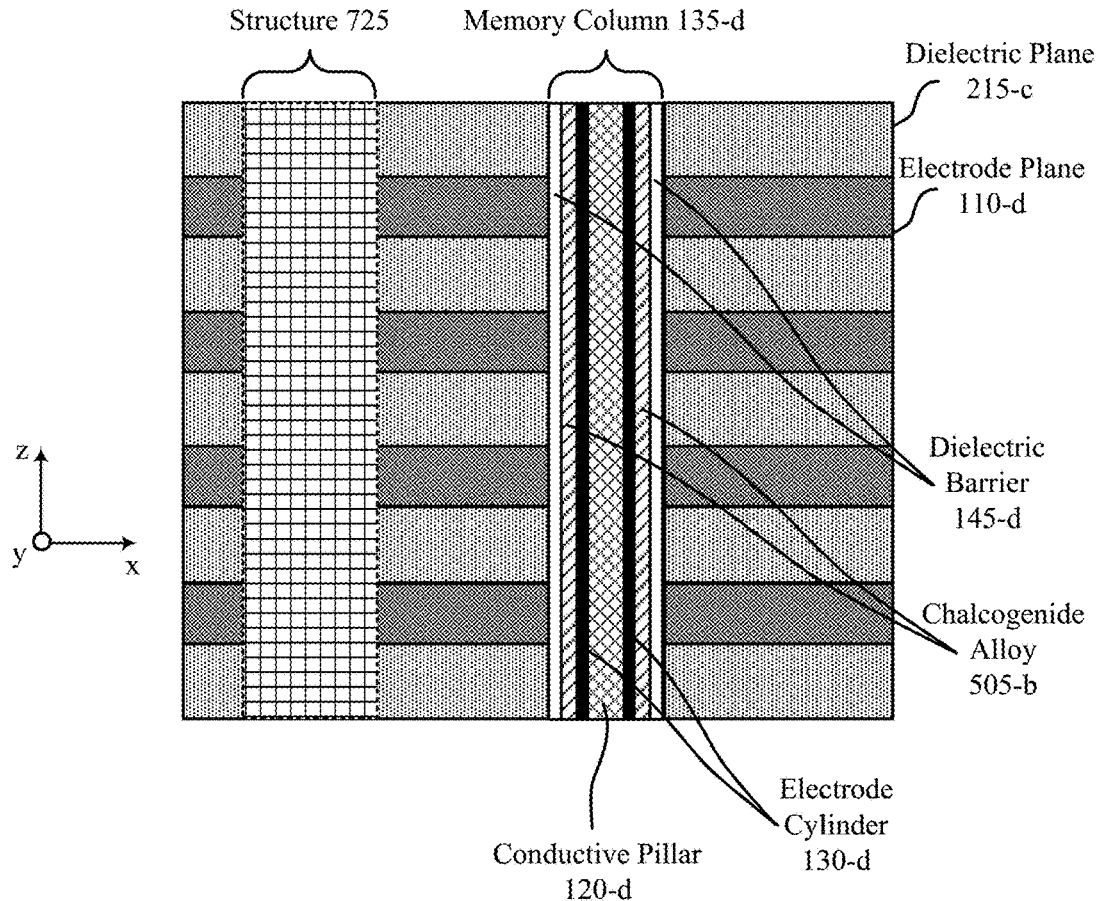
Figure 7F:
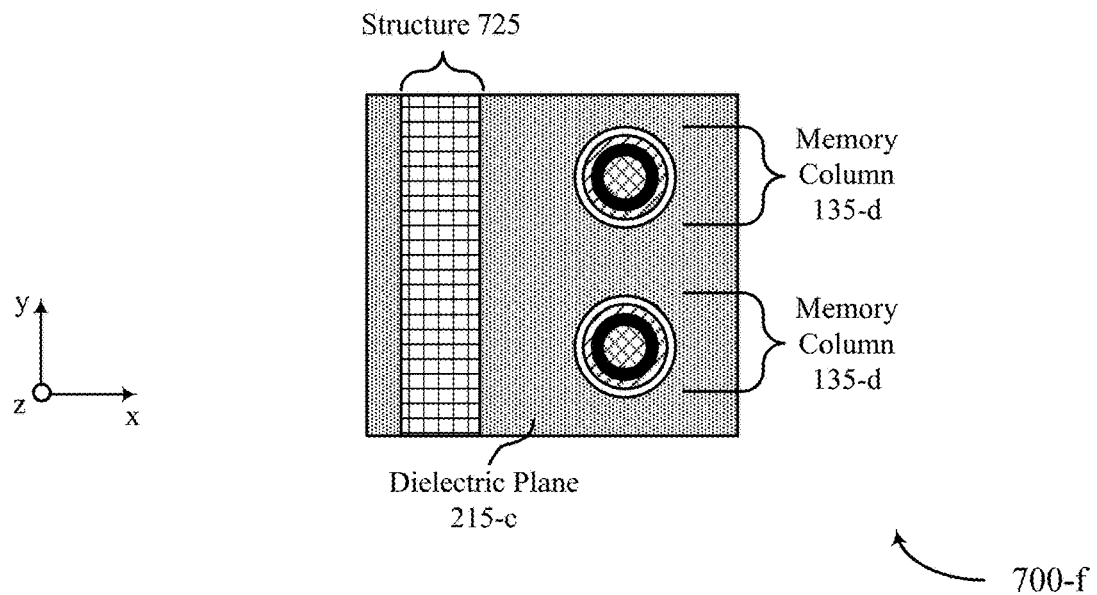

FIG. 7F illustrates a memory array 700-*f* after the second fabrication process. Memory array 700-*f* may be an example of a memory array 700-*e* after some or all of the material in trench 710 has been filled in with a material other than the material in electrode planes 110-*d*. Thus, memory array 700-*f* may include a residual structure 725, which may be composed of an insulating material. As shown in the cross-section view and planar view, the residual structure 725 may be made up of a different material than the dielectric planes 215-*c*. In other examples, the residual structure 725 may be made with the same material that makes up dielectric planes 215-*c*.

Like the memory array formed by the first process, the memory array 700-*f* includes a number of memory columns 135-*d*. Each memory column 135-*d* may include a conductive pillar 120-*d* at least partially surrounded by an electrode cylinder 130-*d*. The electrode cylinder 130-*d* may be at least partially surrounded by a chalcogenide alloy 505-*b*, which may be at least partially surrounded by a dielectric barrier 145-*d*. The dielectric barrier 145-*d* may isolate the chalcogenide alloy 505-*b* from the electrode planes 110-*d* (and in some cases the dielectric planes 215-*c*).

Figure 8:
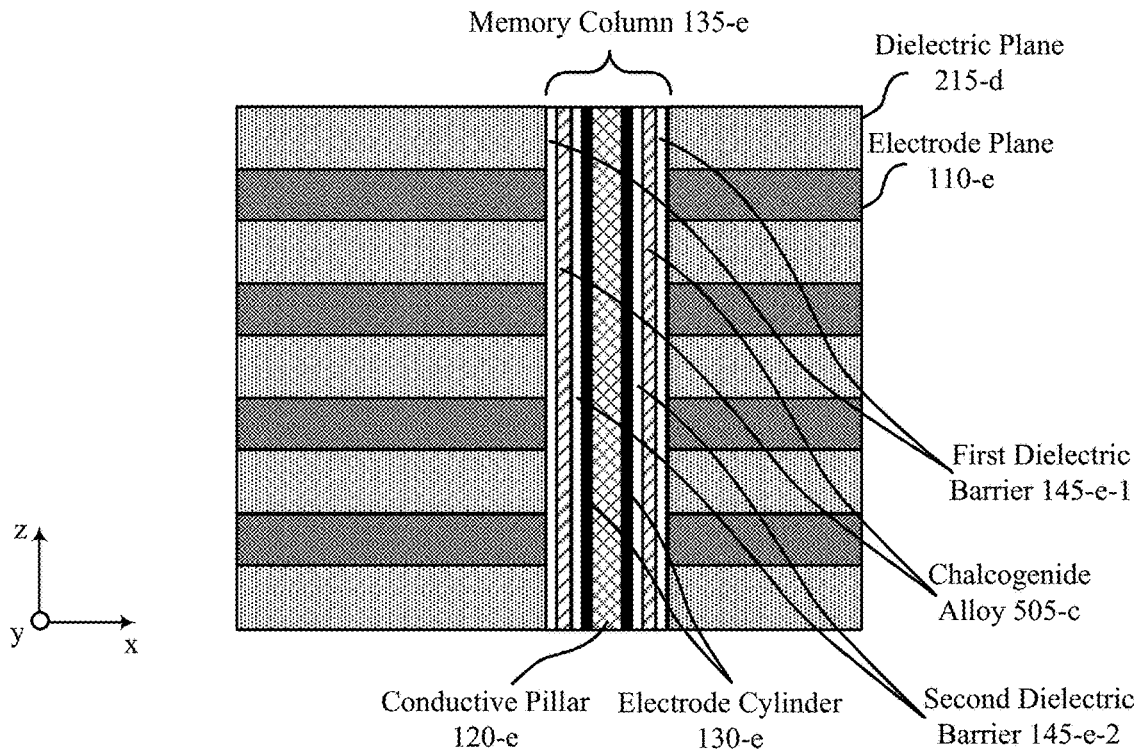
FIG. 8 illustrates a memory array that supports self-selecting memory cells with dielectric barriers in accordance with various embodiments of the present disclosure.

FIG. 8 illustrates a memory array 800 that supports self-selecting memory cells with dielectric barriers. Memory array 800 may include electrode planes 110-*e*, dielectric planes 215-*d*, and memory columns 135-*e*. Memory array 800 may include two dielectric barriers 145-*e*, as opposed to one. For example, memory array 800 may include a first dielectric barrier 145-*e*-1 and a second dielectric barrier 145-*e*-2. Memory column 135-*e* may include a conductive pillar 120-*e* in contact with an electrode cylinder 130-*e* (e.g., the conductive pillar 120-*e* may be in contact with the electrode material in the electrode cylinder 130-*e*). The electrode cylinder 130-*e* may be at least partially surrounded by the second dielectric barrier 145-*e*-2 (e.g., the electrode material of the electrode cylinder 130-*e* may be in contact with the second dielectric barrier 145-*e*-2). The second dielectric barrier 145-*e*-2 may be in contact with the electrode cylinder 130-*e* and may separate or isolate the electrode cylinder 130-*e* from the chalcogenide alloy 505-*c*. The chalcogenide alloy 505-*c* may at least partially surround the second dielectric barrier 145-*e*-2, and in some cases may be in contact with it (e.g., the second dielectric barrier 145-*e*-2 may be in contact with the chalcogenide material of chalcogenide alloy 505-*c*). Thus, the second dielectric barrier 145-*e*-2 may be positioned between the electrode material of electrode cylinder 130-*e* and the chalcogenide material of chalcogenide alloy 505-*c* (e.g., the dielectric material of the second dielectric barrier 145-*e*-2 may at least partially surround the electrode material of electrode cylinder 130-*e*).

The chalcogenide alloy 505-*c* may be at least partially surrounded by the first dielectric barrier 145-*e*-1. The first dielectric barrier 145-*e*-1 may be in contact with the chalcogenide alloy 505-*c* and may separate or isolate the chalcogenide alloy 505-*c* from the electrode planes 110-*e* (and, in some cases, the dielectric planes 215-*d*). In some embodiments, the dielectric barriers 145-*e* may include at least some common characteristics or properties. As one example, the dielectric barriers 145-*e* may be made up of the same or different materials. As another example, the dielectric barriers 145-*e* may have the same or different thicknesses. By positioning the chalcogenide alloy 505-*c* between two dielectric barriers 145-*e*, the symmetry of the memory column 135-*e* may be increased, which may improve the operations and/or predictability of memory array 800. The additional dielectric barrier (e.g., the second dielectric barrier 145-*e*-2) may also decrease interactions between the chalcogenide alloy 505-*c* and the electrode cylinder 130-*e*, among other advantages.

Memory array 800 may be formed using the first fabrication process, described with reference to FIGS. 6A and 6B, or using the second fabrication process, described with reference to FIGS. 7A through 7F. The formation of the second dielectric barrier 145-*e*-2 may include forming dielectric material in contact with the chalcogenide alloy 505-*c* so that the dielectric material at least partially overlaps the chalcogenide alloy 505-*c*. In such cases, the electrode cylinder 130-*e* may be formed by forming electrode material in contact with the second dielectric material so that the electrode material at least partially overlaps the dielectric material.

Figure 9:
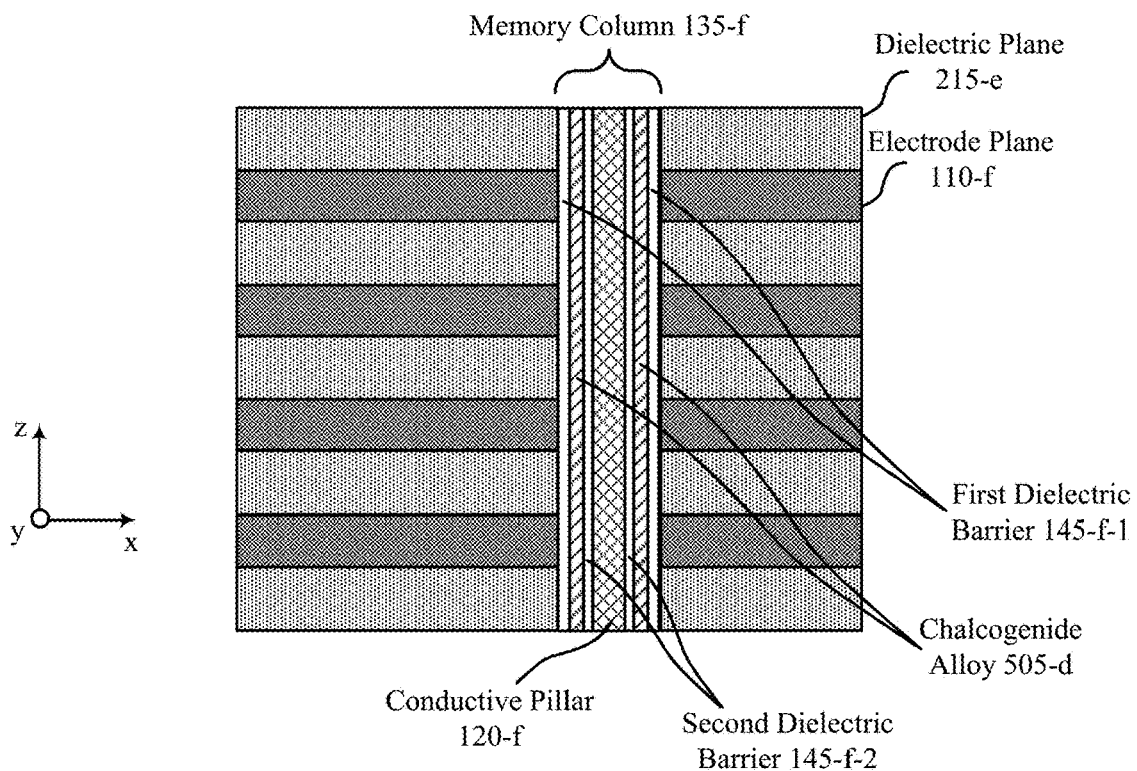
FIG. 9 illustrates a memory array that supports self-selecting memory cells with dielectric barriers in accordance with various embodiments of the present disclosure.

FIG. 9 illustrates a memory array 900 that supports features and operations in accordance with examples of the present disclosure. Memory array 900 may include electrode planes 110-*f*, dielectric planes 215-*e*, and memory columns 135-*f*. Memory array 800 may include two dielectric barriers 145-*f*, as opposed to one. For example, memory array 800 may include a first dielectric barrier 145-*f*-1 and a second dielectric barrier 145-*f*-2. Memory column 135-*f* may include a conductive pillar 120-*f*. The conductive pillar 120-*f* may be in contact with, and at least partially surrounded by, the second dielectric barrier 145-*f*-2 (e.g., the dielectric material of the second dielectric barrier 145-*f*-2 may be positioned between the conductive pillar 120-*f* and the chalcogenide alloy material of chalcogenide alloy 505-*d*).

The second dielectric barrier 145-*f*-2 may be in contact with the chalcogenide alloy 505-*d* and may separate or isolate the chalcogenide alloy 505-*d* from the conductive pillar 120-*f*. The second dielectric barrier 145-*f*-2 may reduce interactions between the chalcogenide alloy 505-*d* and conductive pillar 120-*f* and may increase the symmetry of the memory column 135-*f*.

The chalcogenide alloy 505-*d* may be in contact with, and at least partially surrounded by, the first dielectric barrier 145-*f*-1. The first dielectric barrier 145-*f*-1 may isolate or separate the chalcogenide alloy 505-*d* from the electrode planes 110-*f* (and in some cases, the dielectric planes 215-*e*). The first dielectric barrier 145-*f*-1 may be the same material as the second dielectric barrier 145-*f*-2 or a different material. The first dielectric barrier 145-*f*-1 may be the same thickness as the second dielectric barrier 145-*f*-2 or a different thickness. In some cases, the thickness of the second dielectric barrier 145-*f*-2 may be less than the thickness of the electrode cylinder 130-*e* in memory array 800. In such cases, the diameter of the memory column 135-*f* may be smaller than the diameter of the memory column 135-*e*, which may allow for a more compact memory array 900 (compared to memory array 800 or memory array 500).

Memory array 900 may be formed using the first fabrication process, described with reference to FIGS. 6A and 6B, or using the second fabrication process, described with reference to FIGS. 7A through 7F. The formation of the second dielectric barrier 145-*f*-2 may include forming dielectric material in contact with the conductive pillar 120-*f* so that the dielectric material at least partially surrounds the conductive pillar 120-*f*. In some cases, the conductive pillar 120-*f* may be deposited in an opening in the dielectric material.

Figure 10:
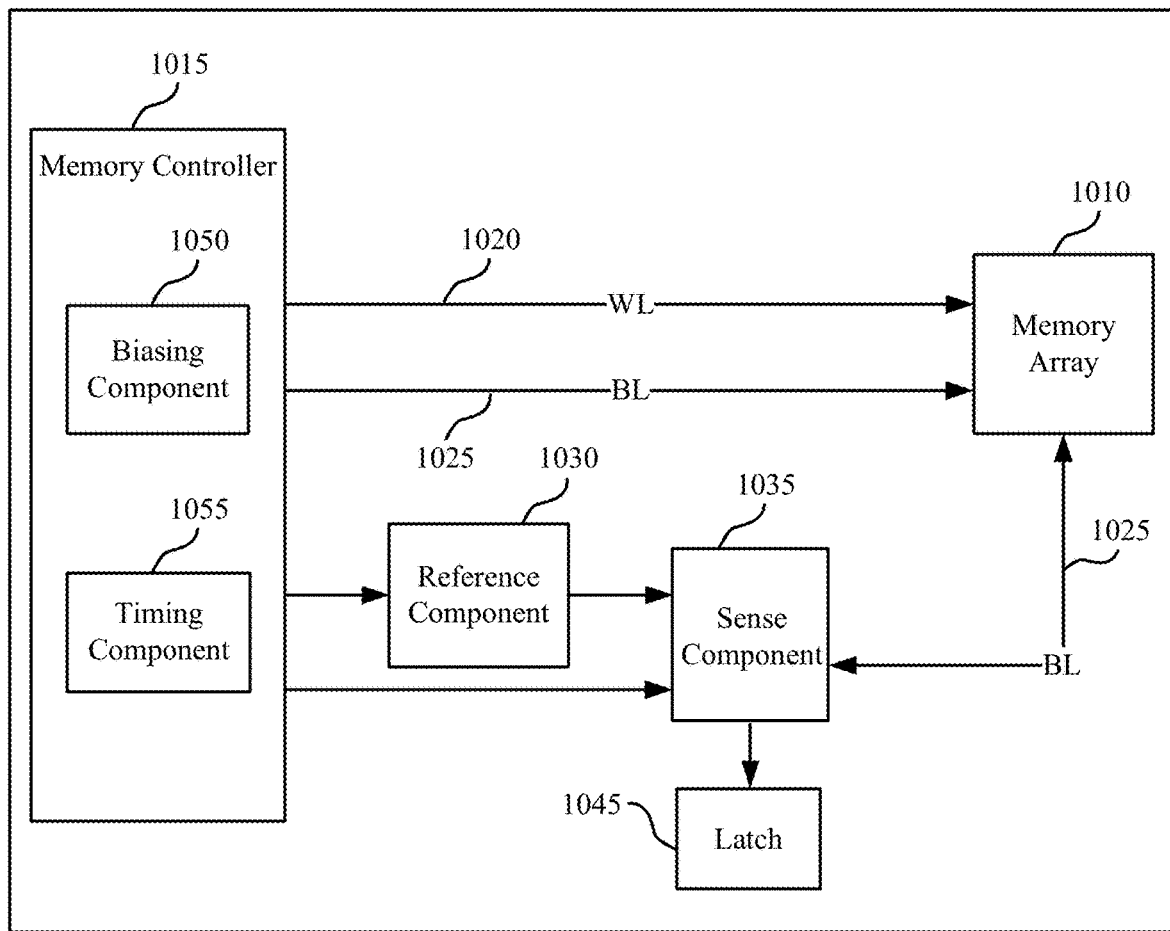
FIG. 10 shows a block diagram of a device that supports self-selecting memory cells with dielectric barriers in accordance with various embodiments of the present disclosure.

FIG. 10 shows a block diagram of a device 1000 that supports self-selecting memory cells with dielectric barriers. Device 1000 may include memory array 1010 and memory controller 1015. Memory array 1010 may be an example of a memory array 100, 200, 500, 600, 700, 800, or 900 described with reference to FIGS. 1, 2, 5, 6A, 6B, 7 through 7F, 8, and 9, respectively. The components of device 1000 may be in electronic communication with each other and may perform functions that facilitate operation of memory array 1010.

Memory controller 1015 may include biasing component 1050 and timing component 1055 and may operate memory array 1010 as described in FIGS. 3 and 4. Memory controller 1015 may be in electronic communication with word lines 1020, which may be coupled with electrode planes 110. Memory controller 1015 may also be in electronic communication with bit lines 1025, which may be coupled with conductive pillars 120. Memory controller 1015 may also be in electronic communication with sense component 1035 and reference component 1030. In some cases, reference component 1030, sense component 1035, and latch 1045 may be components of memory controller 1015.

Memory controller 1015 may be configured to activate various components of memory array 1010 by applying voltages (e.g., positive or negative voltages) to those various components. For example, biasing component 1050 may be configured to apply a voltage to an electrode plane 110 or conductive pillar 120 as described above. For example, biasing component 1050 may apply voltages to an electrode plane 110 and conductive pillar 120 to generate a write voltage or read voltage as described in FIGS. 3 and 4. In some cases, memory controller 1015 may include a row decoder, column decoder, or both, as described with reference to FIG. 1. This may enable memory controller 1015 to access one or more memory cells 105. Biasing component 1050 may also supply voltage to reference component 1030 in order to generate a reference signal for sense component 1035. Additionally, biasing component 1050 may supply voltage for the operation of sense component 1035.

In some cases, memory controller 1015 may perform its operations using timing component 1055. For example, timing component 1055 may control the timing of voltage application to various components of memory array 1010 to perform the memory functions, such as reading and writing, discussed herein. In some cases, timing component 1055 may control the operations of biasing component 1050. For example, timing component 1055 may control the duration of a write pulse or read pulse generated by the biasing component 1050.

Reference component 1030 may include various components to generate a reference signal for sense component 1035. The reference signal may be a voltage or a current. Reference component 1030 may include circuitry specifically configured to produce a reference signal. Sense component 1035 may compare a signal from memory array 101 (through bit line 1025) with a reference signal from reference component 1030. Upon determining the logic state, the sense component 1035 may store the output in latch 1045, where it may be used in accordance with the operations of the device 1000.

Figure 11:
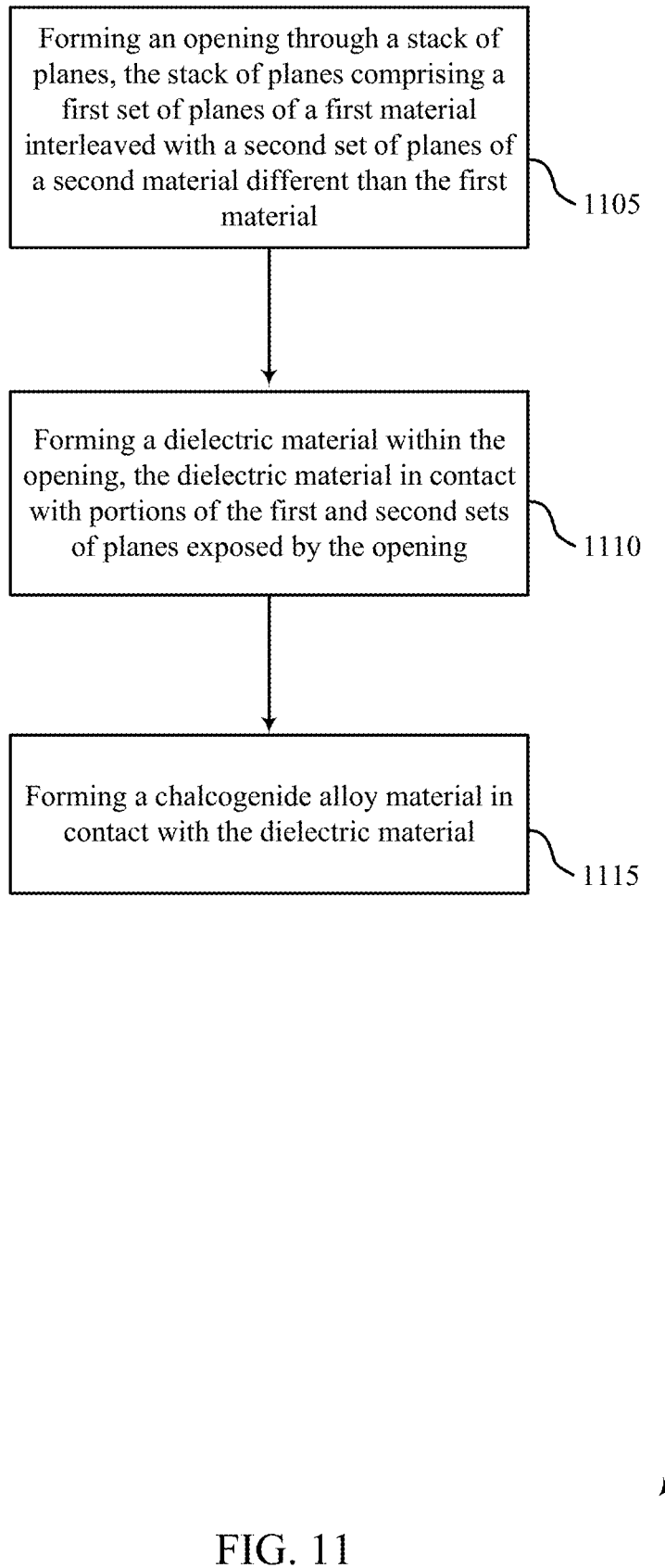
FIG. 11 shows a flowchart illustrating a method of formation for a self-selecting memory cells with a dielectric barrier in accordance with various embodiments of the present disclosure.

FIG. 11 shows a flowchart illustrating a method of formation 1100 for a self-selecting memory structure with dielectric barrier. The method of formation 1100 may be implemented to fabricate a memory array as described with reference FIGS. 1-9. The method of formation may be part of, or include aspects of, the formation processes described with reference to FIGS. 6A-6B and 7A-7F. The memory array formed by the method of formation 1100 may be operated by a memory controller, as described with reference to FIGS. 1 and 10.

At 1105, the method may include forming an opening through a stack of planes. The stack of planes may include a first set of planes of a first material (e.g., a conductive material) interleaved with a second set of planes of a second material (e.g., an insulating material) that is different than the first material. The opening may intersects the first set of planes and the second set of planes. When the first process is used, the first set of planes may be electrode planes and the second set of planes may be dielectric planes, as described with reference to FIG. 6A. When the second process is used, the first set of planes may be placeholder planes (made up of placeholder material) and the second set of planes may be dielectric planes, as described with reference to FIG. 7A. Regardless of which process is used, portions of the first set of planes and the second set of planes may be exposed by the opening. The stack of planes may be formed by forming alternating planes of the first set of planes and the second set of planes.

At block 1110, the method may include forming a dielectric material within the opening. The dielectric material may be formed so that it is in contact with portions of the first and second sets of planes exposed by the opening. The dielectric material may form a dielectric barrier as described with reference to FIGS. 6A-6B, 7A-7F, 8, and 9.

At block 1115, the method may include forming a chalcogenide alloy material in contact with the dielectric material. The chalcogenide alloy material may form a chalcogenide alloy as described with reference to FIGS. 6A-6B, 7A-7F, 8, and 9. Accordingly, the chalcogenide alloy material may be physically separated from the first set of planes, and the second set of planes, by the dielectric material.

In some cases, the method may include replacing the first set of planes with a conductive material that is more conductive that the first material. For example, the method may include removing the first set of planes and forming a third set of planes, made up of the conductive material, in voids left by the removed first set of planes.

In some cases, the method may include forming a trench through the stack of planes. In such cases, the method may also include replacing the first material in the first set of planes with a third material. The replacement may fill the trench with the third material. The method may also include replacing at least a portion of the third material in the trench with a dielectric material.

In some cases, the method may include forming a second dielectric material in contact with the chalcogenide alloy material. The second dielectric material may be formed so that it at least partially overlaps the chalcogenide alloy material. In such cases, the method may also include forming an electrode material in contact with the second dielectric material so that the electrode material at least partially overlaps the second dielectric material. Or the method may include forming a conductive pillar in contact with the second dielectric material.

In some cases, the method may include forming an electrode material in contact with the chalcogenide alloy material so that the electrode material at least partially overlaps the chalcogenide alloy material. The method may also include forming a conductive pillar in contact with the electrode material.

It should be noted that the methods described above describe possible implementations, and that the operations and the steps may be rearranged or otherwise modified and that other implementations are possible. Furthermore, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refers to a relationship between components that supports electron flow between the components. This may include a direct connection between components or may include intermediate components. Components in electronic communication or coupled with one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

The term "isolate" or "isolated" refers to a physical relationship between structures in which the structures are not in contact with each other; structures are isolated from each other if there is another structure or material between them. Current or charge may still flow between two structures that are isolated from each other.

The arrays discussed herein, including memory array 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Chalcogenide materials may be materials or alloys (e.g., doped or undoped alloys) that include at least one of the elements sulfur (S), selenium (Se), and tellurium (Te). Chalcogenide materials and alloys may include, but not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
    a plurality of planes comprising a first set of planes and a second set of planes;
    an elongated conductive element disposed through the plurality of planes;
    an electrode material at least partially surrounding the elongated conductive element;
    a memory material at least partially surrounding the electrode material; and
    a first dielectric material at least partially surrounding the memory material and disposed to separate the memory material from the first set of planes and the second set of planes.

2. The memory device of claim 1, further comprising:
    a second dielectric material positioned between the electrode material and the memory material, wherein the second dielectric material at least partially surrounds the electrode material and the memory material at least partially surrounds the second dielectric material.

3. The memory device of claim 1, wherein the memory material is in contact with the electrode material.

4. The memory device of claim 1, further comprising:
    a second dielectric material positioned between the elongated conductive element and the memory material, wherein the second dielectric material at least partially surrounds the elongated conductive element.

5. The memory device of claim 1, wherein the first set of planes comprises a conductive material and the second set of planes comprises a second material different from the memory material.

6. The memory device of claim 5, wherein the second material comprises a dielectric material.

7. The memory device of claim 1, wherein the first set of planes is disposed orthogonal to the second set of planes.

8. The memory device of claim 1, wherein the first dielectric material is in contact with the first set of planes and the second set of planes.

9. The memory device of claim 1, wherein a thickness of the first dielectric material is less than a thickness of the memory material.

10. The memory device of claim 1, wherein the memory material comprises at least one of a chalcogenide alloy material or a colossal magnetoresistive material.

11. A memory device, comprising:
    a plurality of planes comprising a first set of planes and a second set of planes;
    an elongated conductive element disposed through the plurality of planes;

an electrode material at least partially surrounding the elongated conductive element;

a memory material at least partially surrounding the electrode material, wherein the memory material comprises a polymer-based material; and a first dielectric material at least partially surrounding the memory material and disposed to separate the memory material from the first set of planes and the second set of planes.

12. A memory device, comprising:

a memory stack comprising a first conductive plane and a second plane;

a dielectric barrier disposed through and in contact with the first conductive plane and the second plane;

a memory material in contact with the dielectric barrier and separated from the first conductive plane and the second plane by the dielectric barrier; and an electrode material in contact with the memory material.

13. The memory device of claim 12, further comprising: an elongated conductive element in contact with the electrode material.

14. The memory device of claim 12, further comprising:

a second dielectric barrier in contact with the memory material; and an elongated conductive element in contact with the second dielectric barrier.

15. The memory device of claim 12, wherein the first conductive plane and the second plane are oriented with respect to a same reference plane, and the dielectric barrier is disposed though the first conductive plane and the second plane.

16. The memory device of claim 12, wherein the dielectric barrier is disposed between the memory material and both the first conductive plane and the second plane.

17. The memory device of claim 12, wherein the second plane comprises a dielectric material.

18. The memory device of claim 12, wherein the first conductive plane is in contact with a first side of the second plane, the memory device further comprising:

a second conductive plane in contact with a second side of the second plane opposite the first side.

19. The memory device of claim 12, wherein the memory material comprises at least one of a chalcogenide alloy material or a colossal magnetoresistive material.

20. A memory device, comprising:

a memory stack comprising a first conductive plane and a second plane;

a dielectric barrier disposed through and in contact with the first conductive plane and the second plane;

a memory material in contact with the dielectric barrier and separated from the first conductive plane and the second plane by the dielectric barrier, wherein the memory material comprises a polymer-based material; and an electrode material in contact with the memory material.

21. The memory device of claim 1, wherein the memory material comprises a polymer-based material.

22. The memory device of claim 12, wherein the memory material comprises a polymer-based material.

* * * * *